US012362750B2

(12) United States Patent
Willemin et al.

(10) Patent No.: US 12,362,750 B2
(45) Date of Patent: Jul. 15, 2025

(54) IR TIMING CALIBRATION FOR A KEY SWITCH

(71) Applicant: Logitech Europe S.A., Lausanne (CH)

(72) Inventors: Jérémie Willemin, Zhubei (TW); Yu-Sen Chen, Hsinchu County (TW); Chi-Hsun Tsao, Taoyuan County (TW)

(73) Assignee: Logitech Europe S.A., Lausanne (CH)

( * ) Notice: Subject to any disclaimer, the term of this patent is extended or adjusted under 35 U.S.C. 154(b) by 49 days.

(21) Appl. No.: 18/523,261

(22) Filed: Nov. 29, 2023

(65) Prior Publication Data

US 2025/0175177 A1    May 29, 2025

(51) Int. Cl.
| | | |
|---|---|---|
| *H03K 17/96* | (2006.01) | |
| *G08B 21/18* | (2006.01) | |
| *H01H 13/705* | (2006.01) | |
| *H03K 17/969* | (2006.01) | |

(52) U.S. Cl.
CPC ....... *H03K 17/9636* (2013.01); *G08B 21/182* (2013.01); *H01H 13/705* (2013.01); *H03K 17/9629* (2013.01); *H03K 17/969* (2013.01); *H03K 2217/94104* (2013.01)

(58) Field of Classification Search
CPC .......... H03K 17/9636; H03K 17/9629; H03K 17/969; H03K 2217/94104; G08B 21/182; H01H 13/705
See application file for complete search history.

(56) References Cited

U.S. PATENT DOCUMENTS

| | | | | |
|---|---|---|---|---|
| 3,856,127 A | * | 12/1974 | Halfon | H03K 17/969 250/221 |
| 4,292,515 A | * | 9/1981 | Nelson | H01H 13/70 250/229 |
| 4,534,668 A | * | 8/1985 | Hildel | B41J 5/08 400/477 |
| 2004/0027561 A1 | * | 2/2004 | Takahashi | G11B 7/1356 356/152.2 |
| 2012/0306751 A1 | * | 12/2012 | Massaro | G06F 3/0219 345/168 |
| 2014/0166457 A1 | * | 6/2014 | Chen | H01H 13/83 200/5 A |
| 2014/0168935 A1 | * | 6/2014 | Chen | H01H 3/125 362/23.03 |
| 2014/0183016 A1 | * | 7/2014 | Tu | H01H 13/83 200/314 |

(Continued)

*Primary Examiner* — Amine Benlagsir
(74) *Attorney, Agent, or Firm* — Kilpatrick Townsend & Stockton LLP

(57) ABSTRACT

A keyboard system comprises a key structure including a key switch with a lighting element and phototransistor, and one or more processors that drive the lighting element for a first pulse duration. The output of the phototransistor is determined at the end of the first pulse duration, wherein the key structure is determined to be pressed when the output is below a first output value at an end of the first pulse duration, and unpressed when the output of the phototransistor is above a second output value at the end of the first pulse duration. A fall-time of the output during the first pulse duration is determined and the first pulse duration is calibrated to a second pulse duration when the fall time less than the first pulse duration, the second pulse duration being greater than the fall time and less than the first pulse duration.

20 Claims, 11 Drawing Sheets

(56) References Cited

U.S. PATENT DOCUMENTS

| | | | |
|---|---|---|---|
| 2014/0223561 A1* | 8/2014 | Mitola, III | H04L 67/02 726/23 |
| 2014/0339063 A1* | 11/2014 | Bedolla | G06F 1/1662 427/256 |
| 2015/0061901 A1* | 3/2015 | Casparian | H01H 13/705 341/22 |
| 2015/0061902 A1* | 3/2015 | Casparian | H03K 17/965 341/22 |
| 2015/0109757 A1* | 4/2015 | Chen | H01H 3/125 362/23.03 |

* cited by examiner

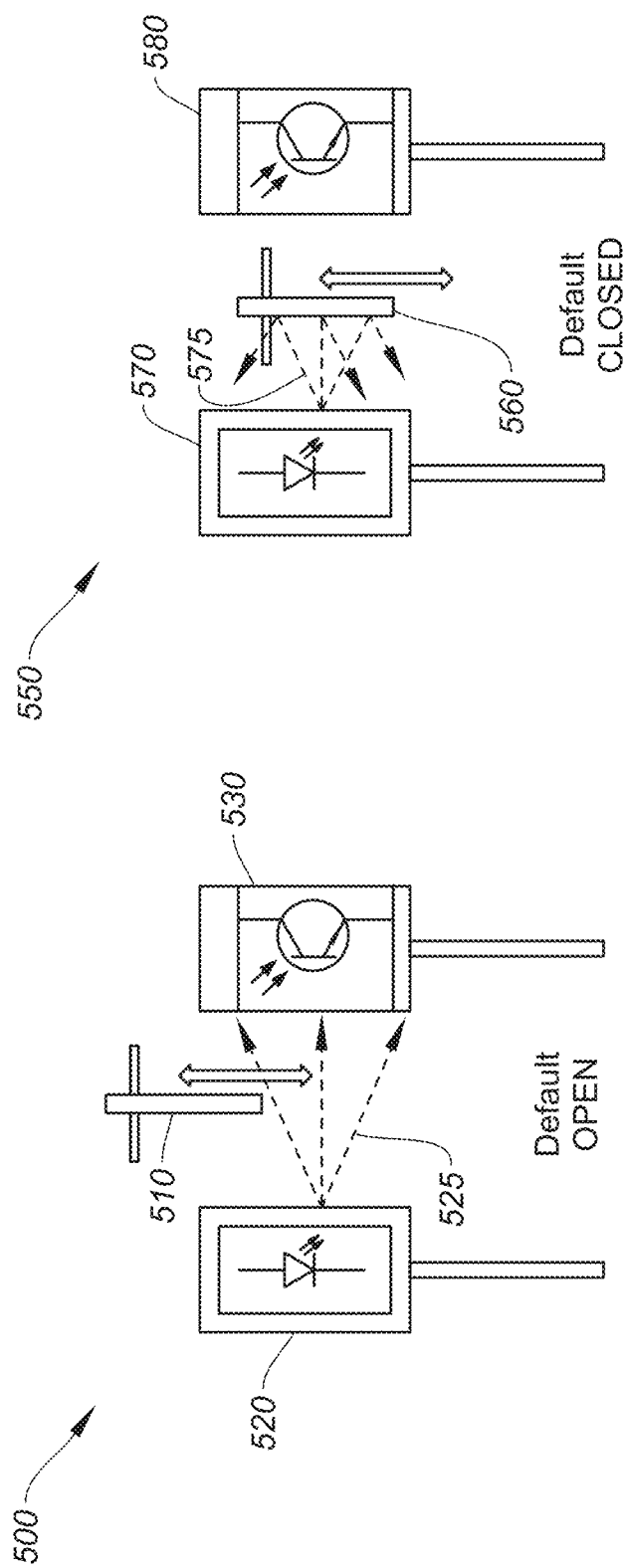

IR TIMING CALIBRATION FOR A KEY SWITCH

BACKGROUND

Input devices are commonplace in modern society and are typically used to convert human-induced analog inputs (e.g., touches, clicks, motions, touch gestures, button presses, scroll wheel rotations, etc.) made in conjunction with an input device into digital signals for computer processing. An input device can include any device that can provide data and control signals to a computing system. Some non-limiting examples of input devices include computer mice, keyboards, virtual reality and/or augmented reality controllers, touch pads, remote controls, gaming controllers, joysticks, trackballs, and the like. Some non-limiting examples of computing systems include desktop computers, laptop computers, netbook computers, gaming consoles, tablets and "phablet" computers, smart phones, personal digital assistants, wearable devices (e.g., smart watches, glasses), virtual reality (VR) and/or augmented reality (AR) headsets and systems, and the like.

Input devices have undergone many marked improvements over the last several decades. In some contemporary input devices, such as computer mice and keyboards, buttons and/or keys often employ contact-based switches for click detection. Contact-based switches have been in the market for many years and have significantly improved in quality and price, but are subject to wear-and-tear over extended use due to repeated contact-based actuation. This can often result in unreliable performance characteristics and low signal-to-noise ratios that would be unacceptable to even casual users, much less the typically more discerning users in the gaming community. As such, better solutions are needed.

Unless otherwise indicated herein, the materials described in this section are not prior art to the claims in this application and are not admitted to be prior art by inclusion in this section.

BRIEF SUMMARY

In some embodiments, a keyboard system comprises a key structure including a key switch comprised of a lighting element and a phototransistor, one or more processors communicatively coupled to the key switch, the one or more processors configured to: drive the lighting element for a first pulse duration, determine an output of the phototransistor at an end of the first pulse duration, determine that the key structure is pressed when the output of the phototransistor is below a first output value at an end of the first pulse duration, determine that the key structure is unpressed when the output of the phototransistor is above a second output value at the end of the first pulse duration, determine a fall-time of the output of the phototransistor during the first pulse duration, and calibrate the first pulse duration to a second pulse duration when the fall time of the output of the phototransistor is less than the first pulse duration, wherein the second pulse duration is greater than the fall time and less than the first pulse duration. In some aspects, the key structure further comprises a switch blocker configured to obstruct a line-of-sight between the lighting element and the phototransistor when the key structure is pressed and clear the line-of-sight when the key structure is unpressed. The lighting element can be an infrared (IR) diode and the phototransistor is an NPN-type transistor.

In some embodiments, a base-emitter junction of the phototransistor is forward biased when the light from the lighting element illuminates a base of the phototransistor, thereby turning the phototransistor on such that the output falls below the first output value, and the base-emitter junction is reverse biased when the light from the lighting element does not illuminate the base of the phototransistor, thereby turning the phototransistor off such that the output remains above the second output value. In certain embodiments, the second pulse duration is equal to the fall time plus a buffer time between 2 µs and 10 µs. The phototransistor may be powered by a power supply voltage (VCC), wherein the first output value is between 0.2 and 0.4 of VCC, and wherein the second output value is between 0.6 and 0.8 of VCC. The key switch can be a hybrid key switch including a contactless key switch comprising the lighting element, the phototransistor, and the switch blocker and a contact-based key switch. The contactless key switch can be an optical key switch and the contact-based key switch is a galvanic key switch. In some cases, the key switch is a normally open switch. Calibrating the first pulse duration to the second pulse duration can occur during a sleep mode of operation.

The keyboard system can further include a plurality of key structures, each having a corresponding lighting element and corresponding phototransistor, wherein determining the fall time of the output includes determining the maximum fall time over the plurality of key structures, and wherein the second pulse duration is greater tan the maximum fall time and less than the first pulse duration. In some embodiments, the one or more processors are operable to track changes in the fall-time of the output over a period of use and generate an alert when the fall-time exceeds a threshold change in fall-time over the period of use. In some aspects, the one or more processors drive the lighting element at a periodic scan rate, wherein the scan rate is increased based on a reduction of the second pulse duration from the first pulse duration.

In certain embodiments, a method of operating a keyboard includes: driving, by one or more processors of the keyboard, a lighting element of a key switch for a first pulse duration; measuring an output of a phototransistor at an end of the first pulse duration; determining that the key switch is pressed when the output of the phototransistor is below a first output value at an end of the first pulse duration; determining that the key switch is unpressed when the output of the phototransistor is above a second output value at the end of the first pulse duration; determining a fall-time of the output of the phototransistor during the first pulse duration; and calibrating the first pulse duration to a second pulse duration when the fall time of the output of the phototransistor is less than the first pulse duration, wherein the second pulse duration is greater than the fall time and less than the first pulse duration. In some cases, the key switch is housed by a key structure, wherein the key structure further comprises a switch blocker configured to obstruct a line-of-sight between the lighting element and the phototransistor when the key structure is pressed and clear the line-of-sight when the key structure is unpressed. The lighting element can be an infrared (IR) diode and the phototransistor is an NPN-type transistor. In some cases, other transistor types can be used (e.g., PNP, FET-type transistors), as would be appreciated by one of ordinary skill in the art with the benefit of this disclosure. In some cases, a base-emitter junction of the phototransistor is forward biased when light from the lighting element illuminates a base of the phototransistor, thereby turning the phototransistor on such that the output falls below the first output value, and wherein the base-emitter junction is reverse biased when the light from the lighting element does not illuminate the base of the phototransistor, thereby turning the phototransistor off such that the output remains above the second output value. In some cases, the second pulse duration is equal to the fall time plus a buffer time between 2 μs and 10 μs. In some embodiments, the phototransistor is powered by a power supply voltage (VCC), wherein the first output value is between 0.2 and 0.4 of VCC, and wherein the second output value is between 0.6 and 0.8 of VCC. The method can further include driving the lighting element at a periodic scan rate and increasing the scan rate based on a reduction of the second pulse duration from the first pulse duration.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention will be more apparent from the following detailed description taken in conjunction with the accompanying drawings, in which:

FIG. 5A shows a simplified circuit diagram of an optical switch sensor with a default open configuration, according to certain embodiments;

FIG. 5B shows a simplified circuit diagram of an optical switch sensor with a default closed configuration, according to certain embodiments;

DETAILED DESCRIPTION

Figure 1:
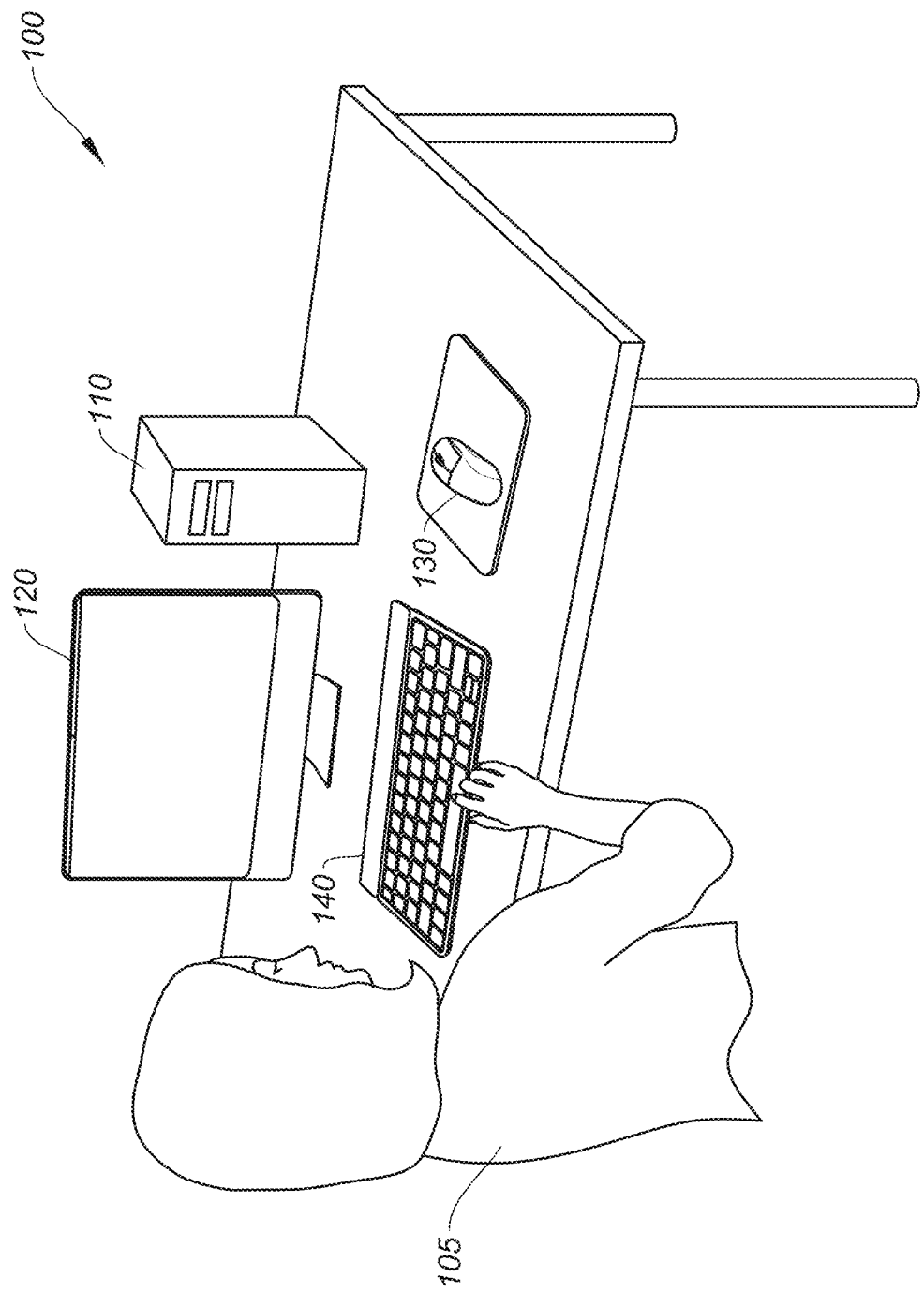
FIG. 1 shows an example of a computer system that can include any of a variety of host computing devices and computer peripheral devices, including computer peripheral devices (e.g., a computer mouse, keyboard, etc.) that can be configured to perform aspects of the various inventive concepts described herein.

Aspects of the present disclosure relate generally to electronic devices, and more particularly to computer peripheral devices that can calibrate an optical drive for improved performance characteristics, according to certain embodiments.

In the following description, various examples of devices utilizing calibration techniques for computer peripheral devices are described. For purposes of explanation, specific configurations and details are set forth to provide a thorough understanding of the embodiments. However, it will be apparent to one skilled in the art that certain embodiments may be practiced or implemented without every detail disclosed. Furthermore, well-known features may be omitted or simplified to prevent any obfuscation of the novel features described herein.

The following high level summary is intended to provide a basic understanding of some of the novel innovations depicted in the figures and presented in the corresponding descriptions provided below. Aspects of the invention relate to computer peripheral devices that can utilize calibration techniques to improve performance characteristics, and more specifically to systems and methods that can reduce a scan time for optical switches in keyed devices, as further described in the embodiments that follow. A computer peripheral device (e.g., keyboard, computer mouse, or more generically, an "input device") is typically used to convert human-induced analog inputs (e.g., button presses, touches, clicks, motions, touch gestures, scroll wheel rotations, etc.) made in conjunction with the input device into digital signals for computer processing. A key (e.g., used on a keyboard), or button (e.g., used in a computer mouse, remote control, game controller, etc.) are common depressible elements that can be depressed by a user to instantiate a type of control signal (e.g., an alphanumeric character, a left/right mouse button, a trigger, etc.). For instance, with keyboard buttons in many contemporary keyboards, the button press detection is typically based on a type of contact-based switch, such as a galvanic or electric switch, where a physical contact between two elements causes the keyboard to generate the control signal (e.g., a key press event). These types of switches have been used for many decades and, through continued innovation, have seen improvements in longevity, reliability, and price. However, contact-based switches (see, e.g., FIG. 4A) are still susceptible to inevitable wear-and-tear as the contacts mechanically or chemically wear out, resulting in poor quality, noisy signals (see, e.g., FIGS. 4B-4C). Some contemporary input devices have incorporated contactless switches (e.g., optical switches-see, e.g., FIGS. 5A-5B). Although contactless switches provide better reliability and longevity as compared to contact-based switches, they can consume significantly more current (e.g., 5-6 mA) even when not being operated (depressed). While there have been improvements in their operating efficiency, contactless switches, and particularly optical switches, regularly consume significantly more power than basic contact-based switches, which consume comparatively negligible current, and particularly when not activated (e.g., not making contact). The majority of the power consumption in optical switches is due to a drive current for the lighting element (e.g., infra-red (IR) LED) that illuminates and thereby biases the corresponding photodetector (e.g., phototransistor) to register whether the key is pressed or not pressed, as further described below. Some of the novel embodiments described below can significantly reduce the power consumption for optical switches by calibrating and ultimately reducing the light emitter (e.g., IR LED) drive time to a duration that better matches the performance characteristics (e.g., rise/fall time) of the photodetectors (e.g., 5-10 µs) in the input device (see, e.g., FIG. 7), rather than using a generic drive time (e.g., 25-30 µs) that conservatively sets a safe drive time that may ensure that all rise/fall times will be complete to reliably read a key press state when manufacturing at scale, but ultimately overestimates the drive time by a large margin that substantially impacts power consumption for key press detection and for the overall system (see, e.g., FIG. 6). Another benefit of reducing the drive time of the light emitter (also referred to as a "lighting element") is that the overall reduction in drive time across all keys can be significant enough such that the scan time (the rate at which the system scans each key) can be substantially reduced, which can allow for faster report rates (e.g., <1 ms) than would otherwise not be possible. While many of the embodiments presented herein are directed to a keyboard key, the novel concepts provided herein can be applied to any input device, as would be appreciated by one of ordinary skill in the art with the benefit of this disclosure.

It is to be understood that this high level summary is presented to provide the reader with a baseline understanding of some of the novel aspects of the present disclosure and a roadmap to the details that follow. This high level summary in no way limits the scope of the various embodiments described throughout the detailed description and each of the figures referenced above are further described below in greater detail and in their proper scope.

FIG. 1 shows an example of a computer system 100 that can include any of a variety of host computing devices and computer peripheral devices, including computer peripheral devices (e.g., keyboard, computer mouse, etc.) that can be configured to perform aspects of the various inventive concepts described herein. Computer system 100 shows a user 105 operating a host computing device (shown as a desktop computer) 110 and a number of computer peripheral devices that can be coupled to and/or integrated with the host computing device, including a display device 120, a computer mouse 130, a keyboard 140, and may include any other suitable computer peripheral device (e.g., microphone, speaker(s), docking station, headphones, etc.). Each computer peripheral device 120-140 can be communicatively coupled to host computing device 110.

Although the host computing device is shown as a desktop computer, other types of host computing devices can be used including gaming systems, laptop computers, set top boxes, entertainment systems, tablet or "phablet" computers, stand-alone head mounted displays ("HMD"), or any other suitable host computing device (e.g., smart phone, smart wearable, or the like). In some cases, multiple host computing devices may be used and one or more of the computer peripheral devices may be communicatively coupled to one or more of the host computing devices (e.g., a computer mouse may be coupled to multiple host computing devices). A host computing device may also be referred to herein as a "host computer," "host device," "computing device," "computer," or the like, and may include a machine readable medium (not shown) configured to store computer code, such as driver software, firmware, and the like, where the computer code may be executable by one or more processors of the host computing device(s) to control aspects of the host computing device, for instance via the one or more computer peripheral devices.

A typical computer peripheral device can include any suitable input device, output device or input/output device including those shown (e.g., a keyboard) and not shown (e.g., remote control, wearables (e.g., gloves, watch, head mounted display), AR/VR controller, CAD controller, joystick, simulation shifter, stylus device, or other suitable device that can be used, for example, to convert analog inputs into digital signals for computer processing. By way of example, a computer peripheral device (e.g., computer mouse 130) can be configured to provide control signals for movement tracking (e.g., x-y movement on a planar surface, three-dimensional "in-air" movements, etc.), touch and/or gesture detection, lift detection, orientation detection (e.g., in 3 degrees-of-freedom (DOF) system, 6 DOF systems, etc.), power management capabilities, input detection (e.g., buttons, scroll wheels, etc.), output functions (e.g., LED control, haptic feedback, etc.), or any of myriad other features that can be provided by a computer peripheral device, as would be appreciated by one of ordinary skill in the art. The buttons of computer mouse 130 and the keys of keyboard 140 (or other depressible element on any input device) may incorporate optical switch architectures with the calibration techniques presented herein and further described below.

An input device may be a computer peripheral device, and may be referred to as either herein, as well as a "peripheral input device," "peripheral," or the like. The majority of the embodiments described herein generally refer to computer peripheral device 140 ("keyboard 140"), however it should be understood that a computer peripheral device can be any suitable input/output (I/O) device (e.g., user interface device, control device, input unit, or the like) that may be adapted to utilize the novel embodiments described and contemplated herein.

A System for Operating a Computer Peripheral Device

Figure 2:
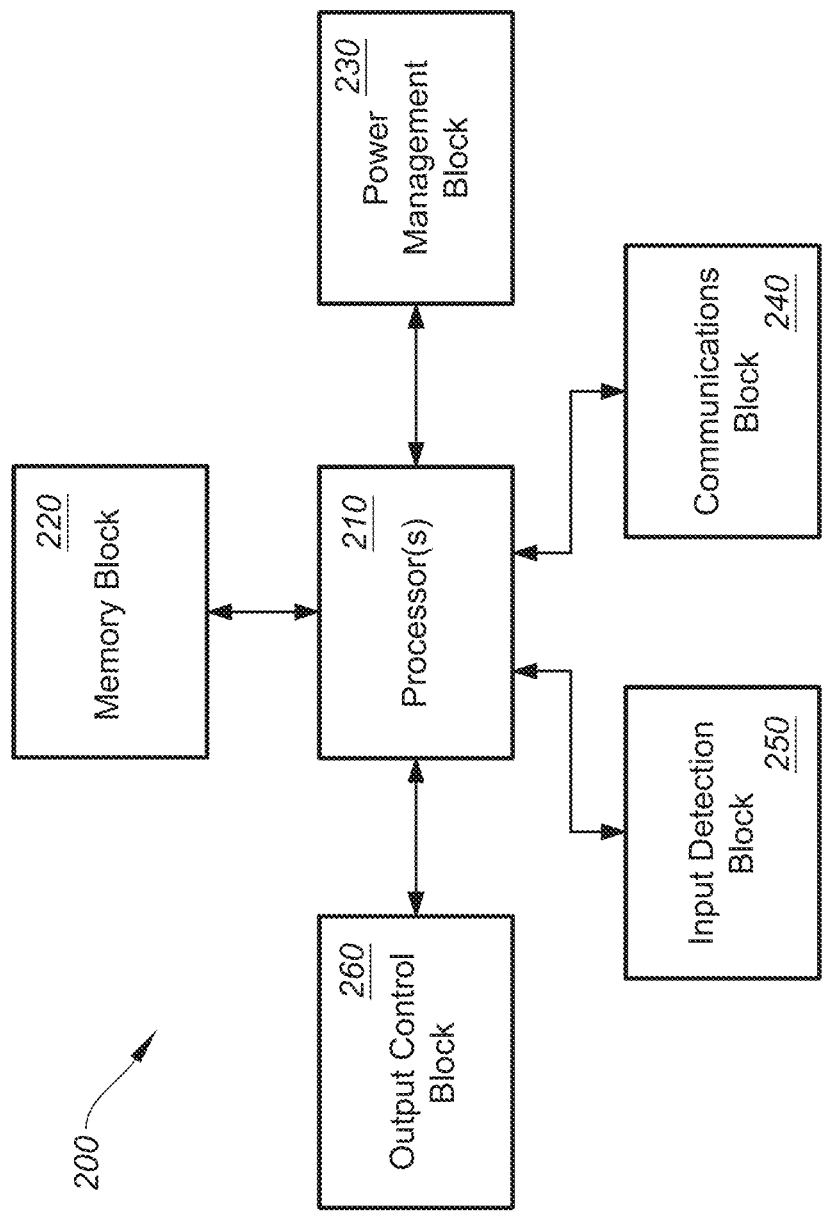
FIG. 2 shows a simplified block diagram of a system configured for operating an input device, according to certain embodiments.

FIG. 2 shows a system 200 for operating a computer peripheral device (e.g., computer mouse 130, keyboard 140, etc.), according to certain embodiments. System 200 may be configured to operate any of the computer peripheral devices specifically shown or not shown herein but within the wide purview of the present disclosure. System 200 may include processor(s) 210, memory block 220, a power management block 230, a communications block 240, an input detection block 250, and an output control block 260. Each of the system blocks 220-260 can be in electronic communication with processor(s) 210 (e.g., via a bus system). System 200 may include additional functional blocks that are not shown or discussed to prevent obfuscation of the novel features described herein. System blocks 220-260 (also referred to as "modules," "systems," or "system blocks") may be implemented as separate modules, or alternatively, more than one system block may be implemented in a single module. In the context described herein, system 200 can be incorporated into any computer peripheral device described or mentioned herein and may be further configured with any of the optical switch calibration implementations presented herein, as described below at least with respect to FIGS. 7-10, as would be appreciated by one of ordinary skill in the art with the benefit of this disclosure.

In certain embodiments, processor(s) 210 may include one or more microprocessors and can be configured to control the operation of system 200. Alternatively or additionally, processor(s) 210 may include one or more microcontrollers (MCUs), digital signal processors (DSPs), or the like, with supporting hardware and/or firmware (e.g., memory, programmable I/Os, etc.), and/or software, as would be appreciated by one of ordinary skill in the art. Processor(s) 210 can control some or all aspects of the operation of computer peripheral device 140 (e.g., system block 220-260). Alternatively or additionally, some of system blocks 220-260 may include an additional dedicated processor, which may work in conjunction with processor(s) 210. For instance, MCUs, uCs, DSPs, and the like, may be configured in other system blocks of system 200. Communications block 240 may include a local processor, for instance, to control aspects of communication with host computer 110 (e.g., via Bluetooth, Bluetooth LE, RF, IR, hardwire, ZigBee, Z-Wave, Logitech Unifying, or other communication protocol). Processor(s) 210 may be local to the peripheral device (e.g., contained therein), may be external to the peripheral device (e.g., off-board processing, such as by a corresponding host computing device), or a combination thereof. Processor(s) 210 may perform any of the various functions and methods (e.g., method 1000) described and/or covered by this disclosure in conjunction with any other system blocks in system 200. In some implementations, processor 302 of FIG. 3 may work in conjunction with processor 210 to perform some or all of the various methods described throughout this disclosure. In some embodiments, multiple processors may enable increased performance characteristics in system 200 (e.g., speed and bandwidth), however multiple processors are not required, nor necessarily germane to the novelty of the embodiments described herein. One of ordinary skill in the art would understand the many variations, modifications, and alternative embodiments that are possible.

Memory block ("memory") 220 can store one or more software programs to be executed by processors (e.g., in processor(s) 210). It should be understood that "software" can refer to sequences of instructions that, when executed by processing unit(s) (e.g., processors, processing devices, etc.), cause system 200 to perform certain operations of software programs. The instructions can be stored as firmware residing in read-only memory (ROM) and/or applications stored in media storage that can be read into memory for execution by processing devices (e.g., processor(s) 210). Software can be implemented as a single program or a collection of separate programs and can be stored in non-volatile storage and copied in whole or in-part to volatile working memory during program execution. In some embodiments, memory 220 may store data corresponding to inputs on the peripheral device, such as a detected movement of the peripheral device sensor (e.g., optical sensor, accelerometer, etc.), activation of one or more input elements (e.g., buttons, sliders, touch-sensitive regions, etc.), or the like. Stored data may be aggregated and send via reports to a host computing device.

In certain embodiments, memory 220 can store the various data described throughout this disclosure. For example, memory 220 can store and/or include instructions configured to perform the various hybrid switch controlling schemas presented herein, such as method 1000. Memory 220 can be used to store any suitable data to perform any function described herein and as would be appreciated by one of ordinary skill in the art with the benefit of this disclosure. Memory array 220 can be referred to as a storage system or storage subsystem, and can store one or more software programs to be executed by processors (e.g., in processor(s) 210). It should be understood that "software" can refer to sequences of instructions that, when executed by processing unit(s) (e.g., processors, processing devices, etc.), cause system 200 to perform certain operations of software programs. The instructions can be stored as firmware residing in read only memory (ROM) and/or applications stored in media storage that can be read into memory for processing by processing devices. Software can be implemented as a single program or a collection of separate programs and can be stored in non-volatile storage and copied in whole or in-part to volatile working memory during program execution. From a storage subsystem, processing devices can retrieve program instructions to execute to run various operations (e.g., software-controlled switches, etc.) as described herein.

Power management system 230 can be configured to manage power distribution, recharging, power efficiency, haptic motor power control, and the like. In some embodiments, power management system 230 can include a battery (not shown), a Universal Serial Bus (USB)-based recharging system for the battery (not shown), and power management devices (e.g., voltage regulators-not shown), and a power grid within system 200 to provide power to each subsystem (e.g., communications block 240, etc.). In certain embodiments, the functions provided by power management system 230 may be incorporated into processor(s) 210. Alternatively, some embodiments may not include a dedicated power management block. For example, functional aspects of power management block 240 may be subsumed by another block (e.g., processor(s) 210) or in combination therewith. The power source can be a replaceable battery, a rechargeable energy storage device (e.g., super capacitor, Lithium Polymer Battery, NiMH, NiCd), a corded power supply, or other suitable power source. The recharging system can be an additional cable (specific for the recharging purpose) or it can use a USB connection to recharge the battery.

Communication system 240 can be configured to enable wireless communication with a corresponding host computing device (e.g., 110), or other devices and/or peripherals, according to certain embodiments. Communication system 240 can be configured to provide radio-frequency (RF), Bluetooth®, Logitech proprietary communication protocol (e.g., Unifying, Gaming Lightspeed, or others), infra-red (IR), ZigBee®, Z-Wave, or other suitable communication technology to communicate with other computing devices and/or peripheral devices. System 200 may optionally comprise a hardwired connection to the corresponding host computing device. For example, input device 140 can be configured to receive a USB, FireWire®, Thunderbolt®, or other universal-type cable to enable bi-directional electronic communication with the corresponding host computing device or other external devices. Some embodiments may utilize different types of cables or connection protocol standards to establish hardwired communication with other entities. In some aspects, communication ports (e.g., USB), power ports, etc., may be considered as part of other blocks described herein (e.g., input detection module 250, output control module 260, etc.). In some aspects, communication system 240 can send reports generated by the processor(s) 210 (e.g., HID data, streaming or aggregated data, etc.) to a host computing device. In some cases, the reports can be generated by the processor(s) only, in conjunction with the processor(s), or other entity in system 200. Communication system 240 may incorporate one or more antennas, oscillators, etc., and may operate at any suitable frequency band (e.g., 2.4 GHz), etc. One of ordinary skill in the art with the benefit of this disclosure would appreciate the many modifications, variations, and alternative embodiments thereof.

Input detection module 250 can control the detection of a user-interaction with input elements (also referred to as "elements") on an input device. For instance, input detection module 250 can detect user inputs from keys or buttons (e.g., depressible elements), roller wheels, motion sensors, scroll wheels, track balls, touch pads (e.g., one and/or two-dimensional touch sensitive touch pads), click wheels, dials, keypads, microphones, GUIs, touch-sensitive GUIs, proximity sensors (e.g., IR, thermal, Hall effect, inductive sensing, etc.) image sensor based detection such as gesture detection (e.g., via webcam), audio based detection such as voice input (e.g., via microphone), or the like, as would be appreciated by one of ordinary skill in the art with the benefit of this disclosure. Alternatively, the functions of input detection module 250 can be subsumed by processor 210, or in combination therewith.

In some embodiments, input detection module 250 can detect a touch or touch gesture on one or more touch sensitive surfaces on input device 140. Input detection block 250 can include one or more touch sensitive surfaces or touch sensors. Touch sensors generally comprise sensing elements suitable to detect a signal such as direct contact, electromagnetic or electrostatic fields, or a beam of electromagnetic radiation. Touch sensors can typically detect changes in a received signal, the presence of a signal, or the absence of a signal. A touch sensor may include a source for emitting the detected signal, or the signal may be generated by a secondary source. Touch sensors may be configured to detect the presence of an object at a distance from a reference zone or point (e.g., <5 mm), contact with a reference zone or point, or a combination thereof. Certain embodiments of computer peripheral device 130, 140 may or may not utilize touch detection or touch sensing capabilities.

Input detection block 250 can include touch and/or proximity sensing capabilities. Some examples of the types of touch/proximity sensors may include, but are not limited to, resistive sensors (e.g., standard air-gap 4-wire based, based on carbon loaded plastics which have different electrical characteristics depending on the pressure (FSR), interpolated FSR, strain gages, etc.), capacitive sensors (e.g., surface capacitance, self-capacitance, mutual capacitance, etc.), optical sensors (e.g., light barrier type (default open or closed), infrared light barriers matrix, laser-based diode coupled with photo-detectors that could measure the time of flight of the light path, etc.), acoustic sensors (e.g., piezo-buzzer coupled with microphones to detect the modification of a wave propagation pattern related to touch points, etc.), inductive sensors, magnetic sensors (e.g., Hall Effect, etc.), or the like.

In some embodiments, output control module 260 can control various outputs for a corresponding computer peripheral device. For instance, output control module 260 may control a number of visual output elements (e.g., LEDs, LCD screens), displays, audio outputs (e.g., speakers), haptic output systems, or the like. One of ordinary skill in the art with the benefit of this disclosure would appreciate the many modifications, variations, and alternative embodiments thereof.

Although certain systems may not be expressly discussed, they should be considered as part of system 200, as would be understood by one of ordinary skill in the art. For example, system 200 may include a bus system to transfer power and/or data to and from the different systems therein. It should be appreciated that system 200 is illustrative and that variations and modifications are possible. System 200 can have other capabilities not specifically described herein. Further, while system 200 is described with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained.

Embodiments of the present invention can be realized in a variety of apparatuses including electronic devices (e.g., computer peripheral devices) implemented using any combination of circuitry and software. Furthermore, aspects and/or portions of system 200 may be combined with or operated by other sub-systems as required by design. For example, input detection block 250 and/or memory 220 may operate within processor(s) 210 instead of functioning as a separate entity. In addition, the inventive concepts described herein can also be applied to any electronic device. Further, system 200 can be applied to any of the computer peripheral devices described in the embodiments herein, whether explicitly, referentially, or tacitly described (e.g., would have been known to be applicable to a particular computer peripheral device by one of ordinary skill in the art). The foregoing embodiments are not intended to be limiting and those of ordinary skill in the art with the benefit of this disclosure would appreciate the myriad applications and possibilities.

System for Operating a Host Computing Device

Figure 3:
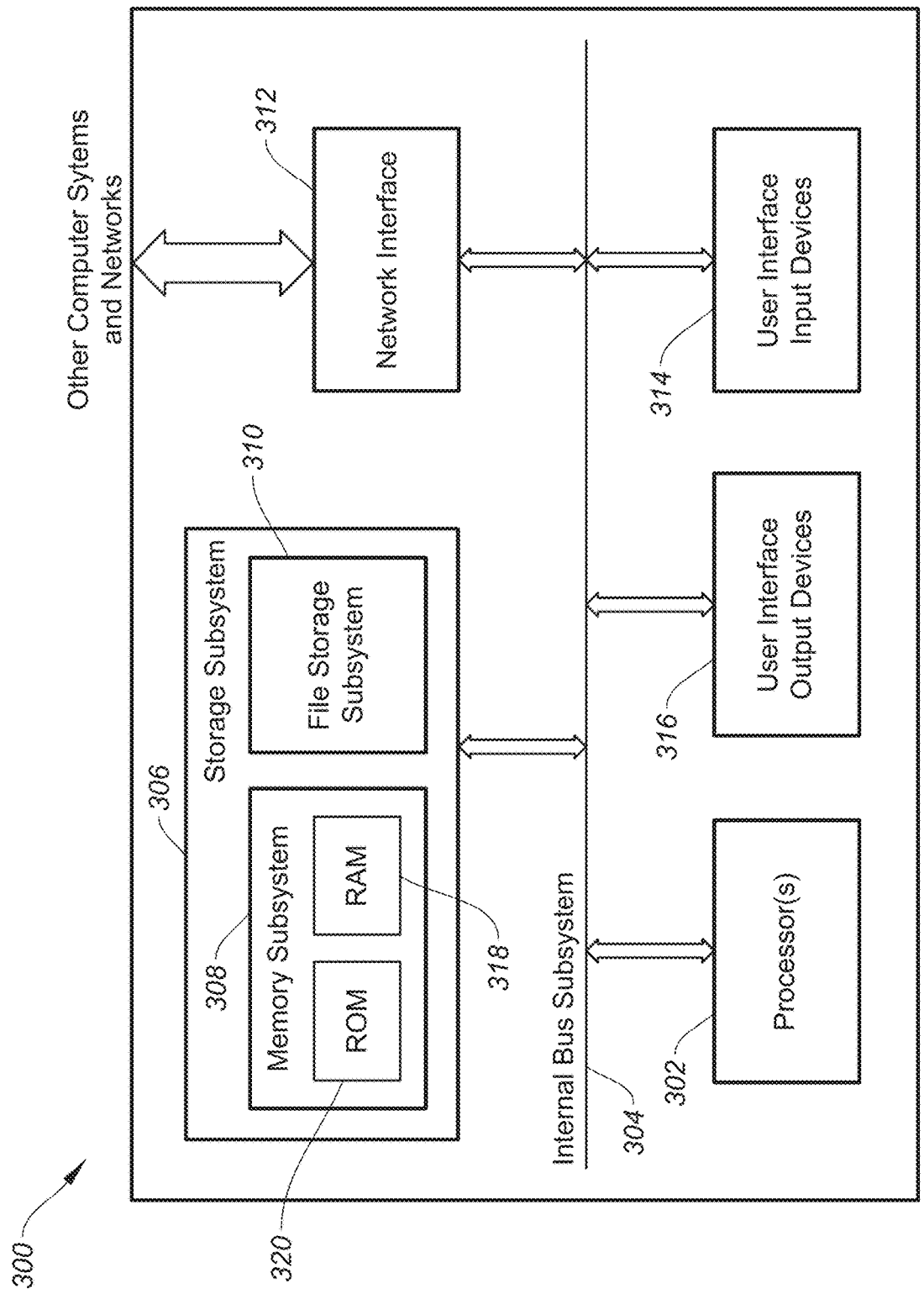
FIG. 3 shows a simplified block diagram of a system for operating a host computing device, according to certain embodiments.

FIG. 3 is a simplified block diagram of a host computing device 300, according to certain embodiments. Host computing device 300 can implement some or all functions, behaviors, and/or capabilities described above that would use electronic storage or processing, as well as other functions, behaviors, or capabilities not expressly described. Host computing device 300 can include a processing subsystem (processor(s)) 302, a storage subsystem 306, user interfaces 314, 316, and a communication interface 312. Computing device 300 can also include other components (not explicitly shown) such as a battery, power controllers, and other components operable to provide various enhanced capabilities. In various embodiments, host computing device 300 can be implemented in any suitable computing device, such as a desktop or laptop computer (e.g., desktop 110), mobile device (e.g., tablet computer, smart phone, mobile phone), gaming console, wearable device, media device, or the like, or in peripheral devices (e.g., keyboards, etc.) in certain implementations.

Processor(s) 302 can include MCU(s), micro-processors, application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, or electronic units designed to perform a function or combination of methods, functions, etc., described throughout this disclosure.

Storage subsystem 306 can be implemented using a local storage and/or removable storage medium, e.g., using disk, flash memory (e.g., secure digital card, universal serial bus flash drive), or any other non-transitory storage medium, or a combination of media, and can include volatile and/or non-volatile storage media. Local storage can include a memory subsystem 308 including random access memory (RAM) 318 such as dynamic RAM (DRAM), static RAM (SRAM), synchronous dynamic RAM (e.g., DDR), or battery backed up RAM or read-only memory (ROM) 320, or a file storage subsystem 310 that may include one or more code modules. In some embodiments, storage subsystem 306 can store one or more applications and/or operating system programs to be executed by processing subsystem 302, including programs to implement some or all operations described above that would be performed using a computer. For example, storage subsystem 306 can store one or more code modules for implementing one or more method steps described herein.

A firmware and/or software implementation may be implemented with modules (e.g., procedures, functions, and so on). A machine-readable medium tangibly embodying instructions may be used in implementing methodologies described herein. Code modules (e.g., instructions stored in memory) may be implemented within a processor or external to the processor. As used herein, the term "memory" refers to a type of long term, short term, volatile, nonvolatile, or other storage medium and is not to be limited to any particular type of memory or number of memories or type of media upon which memory is stored.

Moreover, the term "storage medium" or "storage device" may represent one or more memories for storing data, including read only memory (ROM), RAM, magnetic RAM, core memory, magnetic disk storage mediums, optical storage mediums, flash memory devices and/or other machine readable mediums for storing information. The term "machine-readable medium" includes, but is not limited to, portable or fixed storage devices, optical storage devices, wireless channels, and/or various other storage mediums capable of storing instruction(s) and/or data.

Furthermore, embodiments may be implemented by hardware, software, scripting languages, firmware, middleware, microcode, hardware description languages, and/or any combination thereof. When implemented in software, firmware, middleware, scripting language, and/or microcode, program code or code segments to perform tasks may be stored in a machine readable medium such as a storage medium. A code segment (e.g., code module) or machine-executable instruction may represent a procedure, a function, a subprogram, a program, a routine, a subroutine, a module, a software package, a script, a class, or a combination of instructions, data structures, and/or program statements. A code segment may be coupled to another code segment or a hardware circuit by passing and/or receiving information, data, arguments, parameters, and/or memory contents. Information, arguments, parameters, data, etc. may be passed, forwarded, or transmitted by suitable means including memory sharing, message passing, token passing, network transmission, etc. These descriptions of software, firmware, storage mediums, etc., apply to systems 200 and 300, as well as any other implementations within the wide purview of the present disclosure. In some embodiments, aspects of the invention (e.g., surface classification) may be performed by software stored in storage subsystem 306, stored in memory 220 of a computer peripheral device, or both. One of ordinary skill in the art with the benefit of this disclosure would appreciate the many modifications, variations, and alternative embodiments thereof.

Implementation of the techniques, blocks, steps, and means described throughout the present disclosure may be done in various ways. For example, these techniques, blocks, steps and means may be implemented in hardware, software, or a combination thereof. For a hardware implementation, the processing units may be implemented within one or more ASICs, DSPs, DSPDs, PLDs, FPGAs, processors, controllers, micro-controllers, microprocessors, other electronic units designed to perform the functions described above, and/or a combination thereof.

Each code module may comprise sets of instructions (codes) embodied on a computer-readable medium that directs a processor of a host computing device 110 to perform corresponding actions. The instructions may be configured to run in sequential order, in parallel (such as under different processing threads), or in a combination thereof. After loading a code module on a general purpose computer system, the general purpose computer is transformed into a special purpose computer system.

Computer programs incorporating various features described herein (e.g., in one or more code modules) may be encoded and stored on various computer readable storage media. Computer readable media encoded with the program code may be packaged with a compatible electronic device, or the program code may be provided separately from electronic devices (e.g., via Internet download or as a separately packaged computer readable storage medium). Storage subsystem 306 can also store information useful for establishing network connections using the communication interface 312.

Computer system 300 may include user interface input devices 314 elements (e.g., touch pad, touch screen, scroll wheel, click wheel, dial, button, switch, keypad, microphone, etc.), as well as user interface output devices 316 (e.g., video screen, indicator lights, speakers, headphone jacks, virtual- or augmented-reality display, etc.), together with supporting electronics (e.g., digital to analog or analog to digital converters, signal processors, etc.). A user can operate input devices of user interface 314 to invoke the functionality of computing device 300 and can view and/or hear output from computing device 300 via output devices of user interface 316.

Processing subsystem 302 can be implemented as one or more processors (e.g., integrated circuits, one or more single core or multi core microprocessors, microcontrollers, central processing unit, graphics processing unit, etc.). In operation, processing subsystem 302 can control the operation of computing device 300. In some embodiments, processing subsystem 302 can execute a variety of programs in response to program code and can maintain multiple concurrently executing programs or processes. At a given time, some or all of a program code to be executed can reside in processing subsystem 302 and/or in storage media, such as storage subsystem 304. Through programming, processing subsystem 302 can provide various functionality for computing device 300. Processing subsystem 302 can also execute other programs to control other functions of computing device 300, including programs that may be stored in storage subsystem 304.

Communication interface (also referred to as network interface) 312 can provide voice and/or data communication capability for computing device 300. In some embodiments, communication interface 312 can include radio frequency (RF) transceiver components for accessing wireless data networks (e.g., Wi-Fi network; 3G, 4G/LTE; etc.), mobile communication technologies, components for short range wireless communication (e.g., using Bluetooth communication standards, NFC, etc.), other components, or combinations of technologies. In some embodiments, communication interface 312 can provide wired connectivity (e.g., universal serial bus (USB), Ethernet, universal asynchronous receiver/transmitter, etc.) in addition to, or in lieu of, a wireless interface. Communication interface 312 can be implemented using a combination of hardware (e.g., driver circuits, antennas, modulators/demodulators, encoders/decoders, and other analog and/or digital signal processing circuits) and software components. In some embodiments, communication interface 312 can support multiple communication channels concurrently.

User interface input devices 314 may include any suitable computer peripheral device (e.g., computer mouse, keyboard, gaming controller, remote control, stylus device, etc.), as would be appreciated by one of ordinary skill in the art with the benefit of this disclosure. User interface output devices 316 can include display devices (e.g., a monitor, television, projection device, etc.), audio devices (e.g., speakers, microphones), haptic devices, etc. Note that user interface input and output devices are shown to be a part of system 300 as an integrated system. In some cases, such as in laptop computers, this may be the case as keyboards and input elements as well as a display and output elements are integrated on the same host computing device. In some cases, the input and output devices may be separate from system 300, as shown in FIG. 1. One of ordinary skill in the art with the benefit of this disclosure would appreciate the many modifications, variations, and alternative embodiments thereof.

It will be appreciated that computing device 300 is illustrative and that variations and modifications are possible. A host computing device can have various functionality not specifically described (e.g., voice communication via cellular telephone networks) and can include components appropriate to such functionality. While the computing device 300 is described with reference to particular blocks, it is to be understood that these blocks are defined for convenience of description and are not intended to imply a particular physical arrangement of component parts. For example, processing subsystem 302, storage subsystem 306, user interfaces 314, 316, and communications interface 312 can be in one device or distributed among multiple devices. Further, the blocks need not correspond to physically distinct components.

Blocks can be configured to perform various operations, e.g., by programming a processor or providing appropriate control circuitry, and various blocks might or might not be reconfigurable depending on how an initial configuration is obtained. Embodiments of the present invention can be realized in a variety of apparatus including electronic devices implemented using a combination of circuitry and software. Host computing devices or even peripheral devices described herein can be implemented using system 300.

Contact-Based Switches

In the present computer peripheral market (e.g., keyboard devices), button press detection (e.g., detecting when a depressible element such as a keyboard key or button is depressed) is primarily based on contact-based switches (e.g., galvanic/electric), where a physical contact between two elements causes the input device to generate a control signal. Contact-based switches typically utilize galvanic isolation, which involves isolating functional sections of electrical systems to prevent current flow such that no direct conduction path is possible. In other words, when the physical switch is closed, electric current flows and a signal is typically generated such as a button press signal or other suitable human interface device (HID) signal, as would be appreciated by one of ordinary skill in the art with the benefit of this disclosure. When the switch is open, no electric current flows and typically no HID signal is generated that reflects key press activity. Contact-based switches have been in use for many decades and have been steadily improved for better longevity, reliability, and price over the years. Contact-based switches also have excellent power efficiency. While the switch is open (e.g., while the button is at rest and is not being depressed or activated), there is effectively no current flow and practically zero power consumption (e.g., ignoring negligible micro-amp range leakage currents, etc.). While the switch is closed, which is typically at millisecond range durations, the operating current and corresponding power consumption is still relatively very low (e.g., 100-400 µA or the like). Despite the excellent power consumption characteristics, contact-based switches are subject to repeated mechanical impact and after some time the contacts mechanically or chemically wear out resulting in noisy data that may be unreliable or unusable, which can render the corresponding input device at least partially inoperable and unfit for its intended use.

Figure 4A:
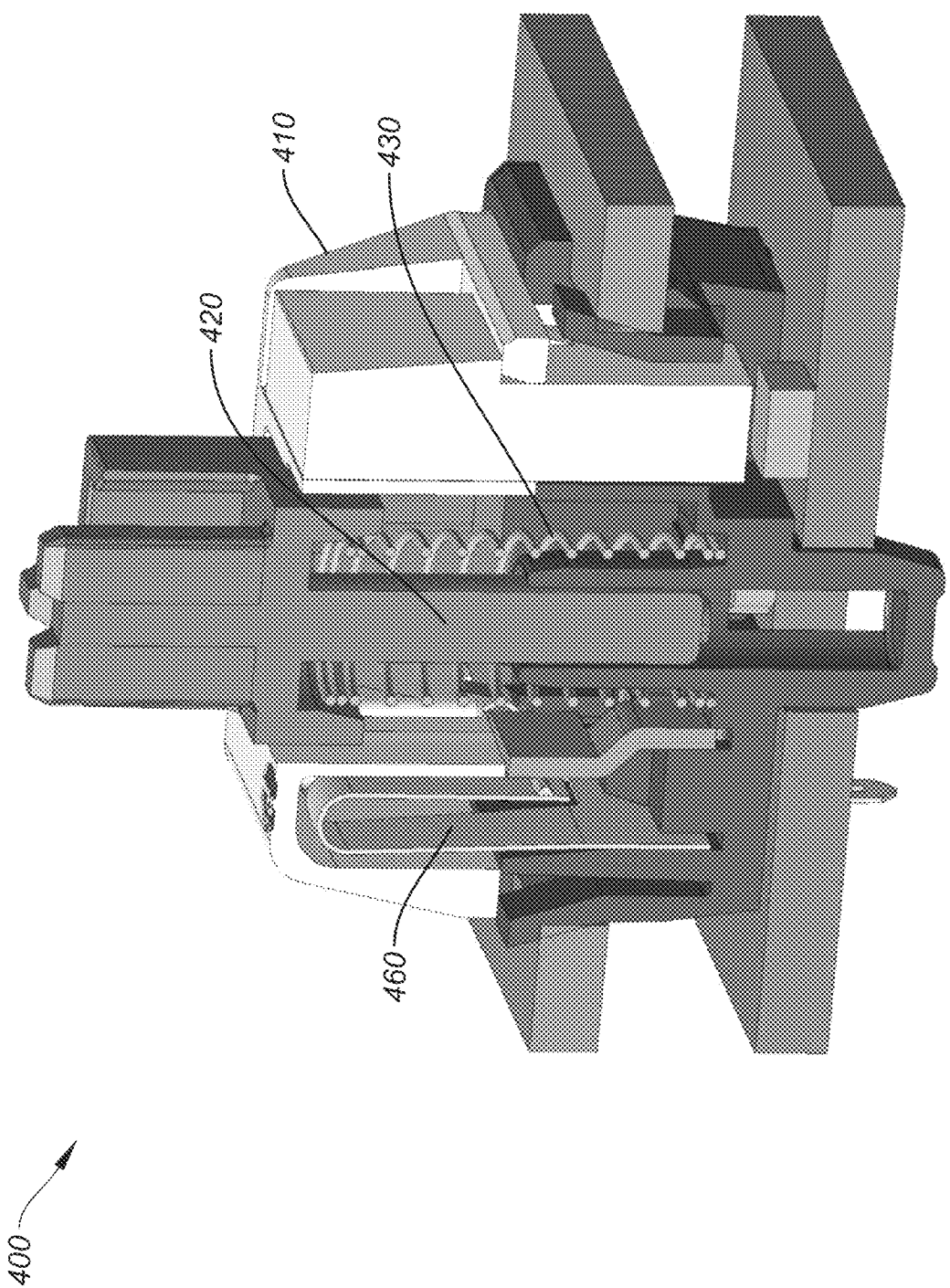
FIG. 4A shows a cross-section of an example of a contact-based switch for an input device.

FIG. 4A shows a cross-section of a simplified example of a contact-based switch 400 of a key structure for an input device. Contact-based switch 400 can include a housing 410, actuator 420, a biasing mechanism 430, terminal section and contact (not fully shown), and feedback profile biasing mechanism 460. Housing 410 is configured to contain and protect the internal mechanisms of switch 400 providing electrical insulation and mechanical integrity. Housing 410 may be a self-contained subassembly of an input device (e.g., keyboard), although some embodiments may employ multiple switches in a shared housing.

Actuator 420 can be configured to transfer a movement and external imparted force to the internal mechanism of switch 400. For example, a user may press actuator 420 directly or indirectly (e.g., via a button, key cap, etc., coupled to actuator 420) to cause actuator 420 to move according to a linear translational path and impart a force onto biasing mechanism 430. In some aspects, the depressible element can be the key or button in combination with actuator 420, as would be appreciated by one of ordinary skill in the art with the benefit of this disclosure. Actuator 420 may be comprised of multiple elements, including user interface elements (e.g., mouse button, key cap, etc.) and internal elements to better transfer force to internal components. Any suitable shape or number of elements can be used as would be appreciated by one of ordinary skill in the art with the benefit of this disclosure.

Biasing mechanism 430 can provide a restoring force to return the key to its original non-pressed position. Actuator 420 typically imparts a user-induced force (e.g., from a button or key press) causing the terminal section and contact to move from a first position—an open circuit condition, to a second position—a closed circuit condition where electrical contact is made. In some cases, the first position may correspond to the depressible element (e.g., actuator 420 and corresponding elements) being non-pressed to a particular position or within a range of positions such that contact 450 does not make electrical contact, and the second position may correspond to the depressible element being depressed enough to make electrical contact. Biasing mechanism 460 may be configured to provide the feedback profile by providing a "click" or other suitable feedback (e.g., increasing feedback followed by release) to provide a suitable tactile feedback experience for the user. FIG. 4A provides one simplified embodiment of a contact-based switch and one of ordinary skill in the art with the benefit of this disclosure would appreciate the many modifications, variations, and alternative embodiments thereof.

Figure 4B:
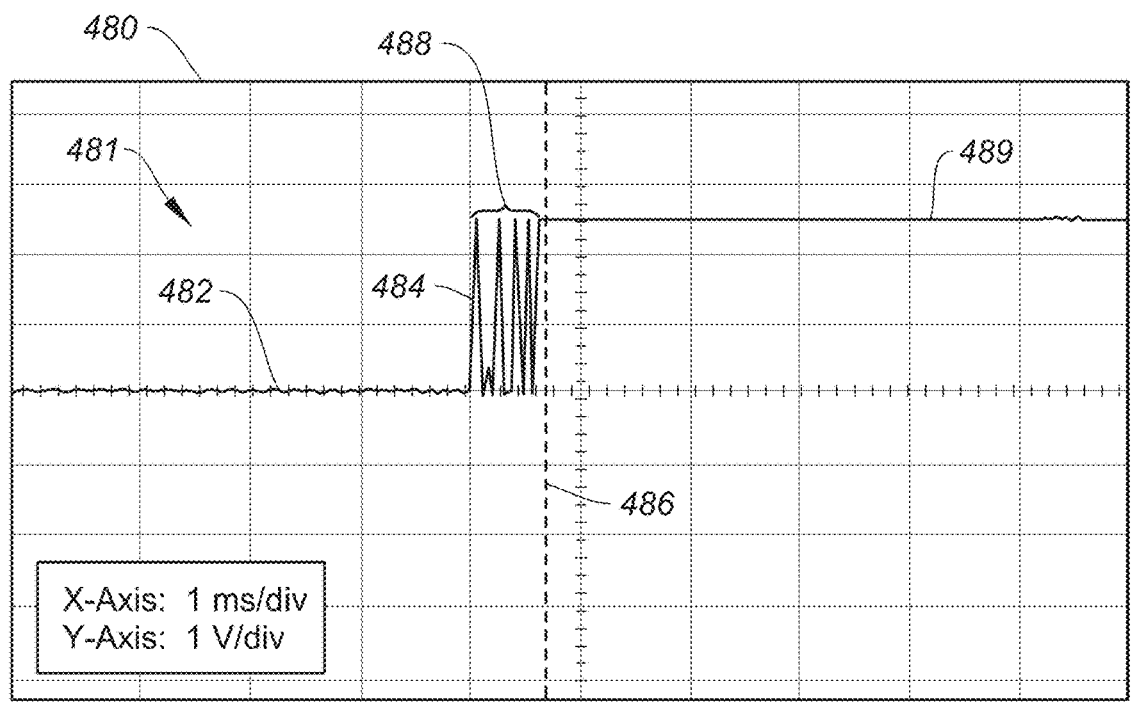
FIG. 4B is a signal diagram showing an example of a typical signal corresponding to a click event by a properly functioning contact-based switch.

FIG. 4B is a signal diagram 480 showing an example of a typical signal 481 corresponding to a click event by a properly functioning contact-based switch. Signal 481 switches from low voltage (e.g., electrical ground) 482 to a higher voltage (e.g., rail voltage) 489 when a first contact terminal makes electrical contact with another contact terminal (not shown). A typical contact-based switch in good condition (e.g., no considerable wear-and-tear) literally bounces briefly when contact is made, which typically last about 2-5 μs micro/milliseconds, and manifests in the signal as a signal ripple 488. This occurs during normal operation and typically does not affect the ability to decipher button inputs, however debouncing algorithms to interpret and account of bouncing may add some latency to detection (e.g., 1 ms or more). A clean, fully transitioned signal 489 occurs after the bouncing decays at threshold 486 (e.g., typically 2 V, 3.3 V, or the like). With a "good" contact, the bouncing may last approximately 0.7 ms and typically less than 1-2 ms, although other durations are possible. A typical click from a user may be as short as 30 ms, thus 1 ms bouncing is often inconsequential when trying to ascertain the intended input (e.g., single click, double click, etc.).

Figure 4C:
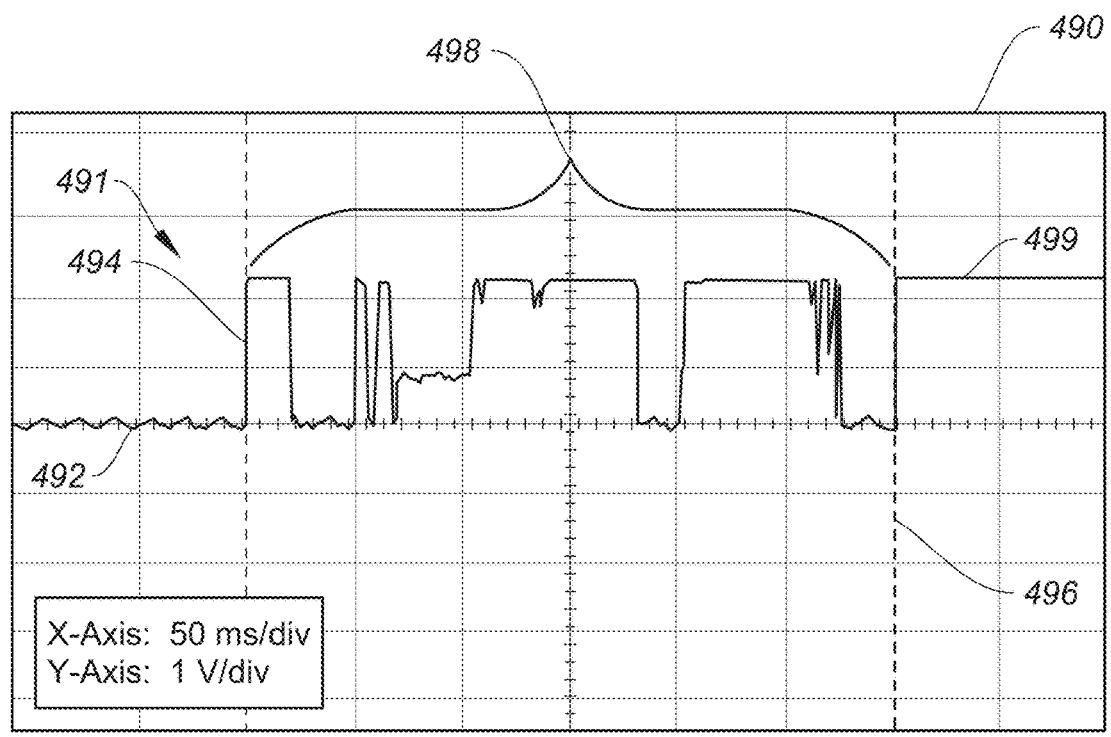
FIG. 4C is a signal diagram showing an example of a possible signal corresponding to a click event by an improperly functioning contact-based switch.

FIG. 4C shows an example of a possible signal corresponding to a click event by an improperly functioning contact-based switch. As can be seen in FIG. 4C, signal 491 is noisy and does not show a clean transition between a low and high voltage in response to the depressible element being pressed and causing a first contact terminal to make contact with the second contact terminal. Signal 491 transition from a low voltage 492 to a relatively long period of signal noise 498 until a solid high voltage signal 499 is recognized at threshold 496. It is unclear whether the noise includes ripple, if a double press occurred, etc., and an unreliable output may result. The deleterious noise occurs for approximately 300 ms. Since a typical user click may take approximately 30 ms, it can be plainly seen how interpreting a user input (e.g., click, double click, click-and-hold, etc.) can be misinterpreted, and in some cases the noise may not actually be related to a user input at all. FIG. 4C is indicative of some contact-based switches with substantial wear-and-tear on the contact and/or the corresponding terminals, which can limit the operational life of the input device, as noted above. It should be noted that the various durations presented herein are provided for context and other durations are possible, as would be appreciated by one of ordinary skill in the art with the benefit of this disclosure. Furthermore, FIGS. 4B-4C shows a normally low signal (e.g., 0 V with no key press) that goes high (e.g., 2.5 V) when a mechanical contact is made, and back down when contact is released. Some embodiments may be configured with a normally high signal that goes low when a mechanical contact is made, and goes back to a high signal when released. One of ordinary skill in the art with the benefit of this disclosure would appreciate the many modifications, variations, and alternative embodiments thereof.

Contactless Switches

In light of the longevity and reliability problems typically associated with contact-based switches, some contemporary manufacturers have changed to contactless switches. A contactless switch typically does not have mechanically interfacing elements (no contacts) during operation and can have a substantially longer operational life since there are no critical components subject to wear-and-tear. Thus, contactless switches can provide very clean signals (e.g., no bouncing, intermittent contacting, etc.) to allow the input device to have a longer operational life. Some non-limiting examples of contactless switches include optical switches (described in embodiments herein), magnetic switches, inductive switches, capacitive switches, piezo switches, and the like. In addition, because contactless switches do not involve a physical contact between elements, no additional latency is needed to apply debouncing algorithms, and the like. Despite these advantages, contactless switches (e.g., optical switches) can consume significantly more current than a contact-based switch as they have to be actively scanned (e.g., continuously or periodically) to confirm whether the switch is open or closed, as noted above.

FIG. 5A shows a simplified circuit diagram of an optical switch sensor 500 with a default-open configuration, according to certain embodiments. Optical switch sensor ("optical switch") 500 can include a lighting element 520 (also referred to as an "emitter" or "light emitter"), a receiver 530 (e.g., phototransistor), and a barrier 510 (also referred to as a "blocker," "switch blocker," or "shutter") that is typically directly or indirectly coupled to an actuator (e.g., similar to actuator 420) to move up and down in correspondence with the movements of the depressible element of the key structure. Typically, barrier 510 can move from a first position that does not obstruct a line-of-sight between emitter 520 and receiver 530 and a second position that obstructs the line-of-sight. Barrier 510 may provide an analog-like operation by allowing a user to adjust a position of barrier 510 by modulating an amount of obstruction that can range from complete obstruction, to some obstruction, to no obstruction. In operation, emitter 520 typically includes a light emitting diode (e.g., IR LED) that is pulsed (e.g., 2-50 μs) at an LED current (e.g., 2-10 mA) and a fixed frequency ("scan rate") (e.g., 1 ms), which is typical in contemporary high-end gaming peripherals (e.g., computer mice and keyboards). The light 525 is projected from emitter 520 towards receiver 530, which can be a phototransistor or other light-sensing element. The amount of current generated by receiver 530 can correspond to an amount of light 525 received from emitter 520. Unlike contact-based switches, which typically have a binary output including an "on" (closed circuit) or "off" (open circuit) operation, contactless switches may allow no light, some light, or all light emitted from emitter 520 to reach receiver 530, thus allowing any number of intermediary settings and can allow a user to set an "on" condition to any suitable actuation threshold (e.g., corresponding output from receiver 530), which can correspond to how far a button or key needs to be pressed to instantiate a key press. Optical switch 500 is in a normally open configuration where the switch allows light 525 emitted from emitter 520 to reach receiver 530 unobstructed when the actuator that controls barrier 510 is not pressed, and blocks the light 525 from emitter 520 when the actuator is depressed.

FIG. 5B shows a simplified circuit diagram of an optical switch sensor 550 with a normally-closed configuration where the switch blocks light 575 emitted from emitter 570 to reach receiver 580 when the actuator that controls barrier 560 is not pressed, and allows the light 575 from emitter 570 to reach receiver 580 when the actuator is depressed. In either configuration, despite the advantages of having a clean signal (e.g., no bouncing or corresponding latency to debounce), an ability to set an actuation threshold, and substantially improved longevity over contact-based switches, contactless switches may utilize power continuously or periodically, even when the depressible element is not pressed in order to detect when the state of the button in an acceptably fast time (e.g., within 1 ms), and thus utilizes substantially more power than contact-based switches. In certain embodiments, reducing the light emitter drive time can substantially improve the power consumption of optical switch topologies, particularly in systems with a high number of keys like a computer keyboard.

Optical Drive Calibration

Input devices (e.g., keyboards, computer mice) with key structures that utilize optical switches can provide better reliability and longevity as compared to contact-based switches, as described above. However, some input devices may consume significantly more current (e.g., 5-6 mA) even when the corresponding key(s) are not being depressed, which can be problematic for wireless, battery-operated input devices with limited power resources. The majority of the power consumption in optical switches is due to the drive current for the lighting element (e.g., IR LED) that illuminates and biases the corresponding photodetector (e.g., phototransistor) to register whether the key is pressed or not pressed (depending on whether the optical switch is normally open or normally closed), as further described below. Some of the novel embodiments described below can significantly reduce the power consumption for optical switches by calibrating and ultimately reducing the light emitter (e.g., IR LED) drive time to a duration that better matches the performance characteristics (e.g., rise/fall time) of the photodetectors (e.g., 5-10 µs) in the input device, rather than using a generic drive time (e.g., 25-30 µs) that conservatively sets a safe drive time that may ensure that all rise/fall times will be complete to reliably read a key press state when manufacturing at scale, but ultimately overestimates the drive time by a large margin that substantially impacts power consumption for key press detection and for the overall system. Another benefit of reducing the drive time of the light emitter ("lighting element") is that the overall reduction in drive time across all keys can be significant enough such that the scan time (the rate at which the system scans each key) can be substantially reduced, which can allow for faster report rates (e.g., <500 µs) than would otherwise not be possible. While many of the embodiments presented herein are directed to a keyboard key, the novel concepts provided herein can be applied to any input device. Furthermore, many of the embodiments describe the use of particular light emitters and photodetectors. It should be noted that any type of light emitter (e.g., IR, visible light, etc) or photodetector (e.g., bipolar junction transistors (BJT), npn or pnp-type BJTs, field effect transistors (FET), or other suitable photodetector type can be used, as would be appreciated by one of ordinary skill in the art with the benefit of this disclosure.

In some cases, phototransistors used in optical switch applications may have a signal fall time (and/or rise time) range between about 3 µs-13 µs, and typically centered around 5 µs. The signal fall-time range may correspond to design tolerances, but may not necessarily factor in switch degradation and other deleterious conditions over time. Some of these issues that can have a negative impact on a total time to detect a rise/fall time may include light emitter or phototransistor specification tolerances, system design tolerances, component bin matching distributions, manufacturing alignment tolerances (e.g., the alignment between the light emitter and the phototransistor), dust or other particle accumulation, IR LED decay, and more, as would be appreciated by one of ordinary skill in the art with the benefit of this disclosure. To account for all of these potential contributors to higher rise/fall times, some conventional designs may set a fixed, conservative IR pulse duration (the drive time of the lighting element) with a wide enough time margin (e.g., 25 us) to account for wide tolerances, deleterious conditions and degradations, etc., as noted above.

Some embodiments presented herein provide a method of calibration that can optimize or improve the pulse duration in the field on a product-by-product basis and many times over, rather than conventional designs that set a fixed IR pulse duration typically at manufacturing or assembly. This novel calibration implementation (see, e.g., FIGS. 7-10) can substantially improve power consumption and battery life, can be realized using a relatively simple embedded software (ESW) implementation, such that very little MCU processor power is required with no need for a complex scan strategy. The various novel embodiments presented herein can also facilitate failure prevention by early detection of component degradation (e.g., light emitter, photodetector). Furthermore, a shorter pulse duration can allow a faster scan time, as noted above. Though many embodiments show and describe implementations in keyboards using optical switches in a normally-open configuration, any suitable input device (e.g., computer mouse) can incorporate the novel calibration technology for optical switches described herein, including optical-only key structures or hybrid switch (e.g., incorporating both contractless (e.g., optical) and contact-based (e.g., galvanic) technologies.

Figure 6:
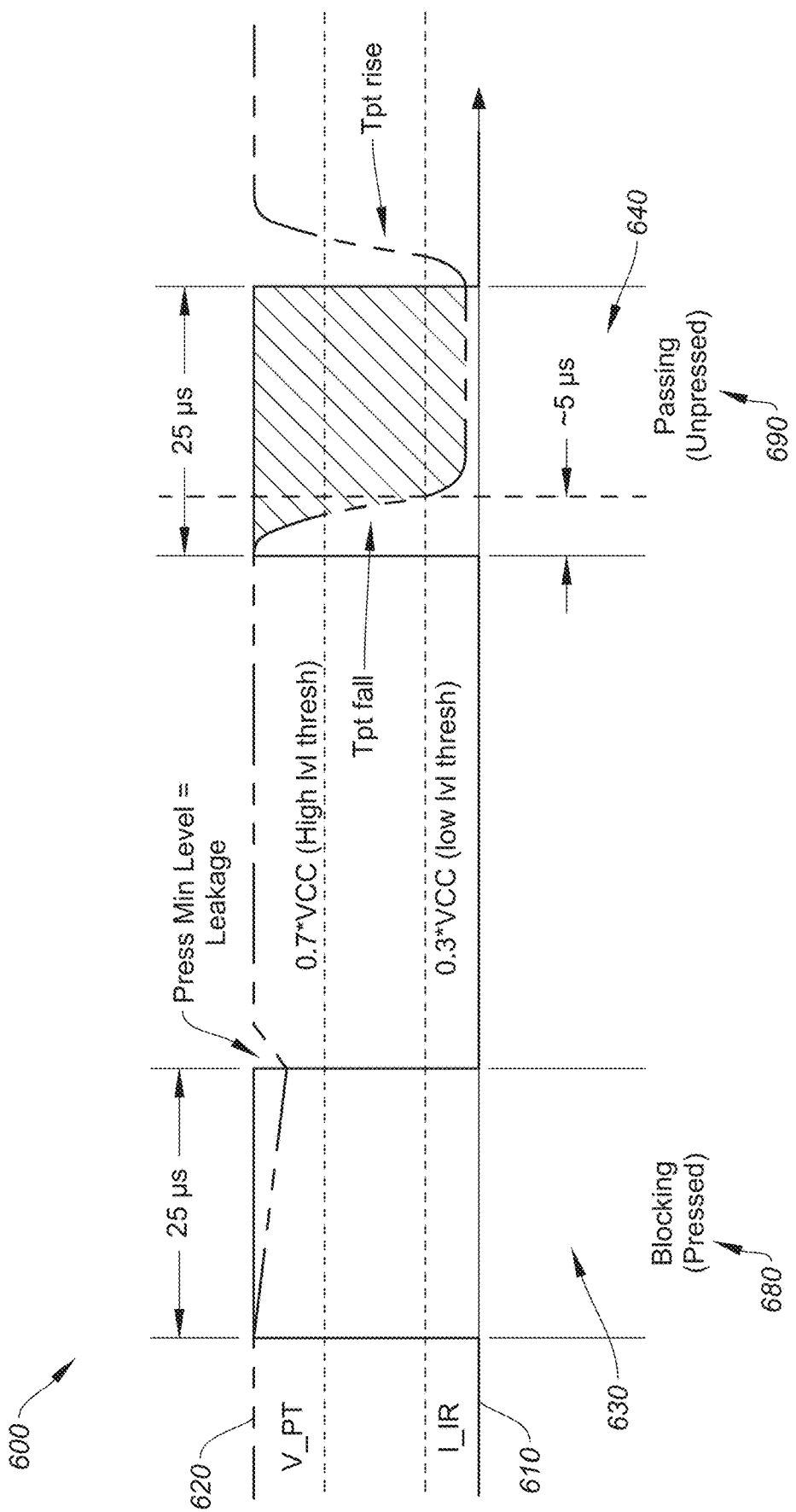
FIG. 6 shows a simplified signal timing diagram for an optical switch sensor, according to certain embodiments.

FIG. 6 shows a simplified signal timing diagram 600 for an optical switch sensor, according to certain embodiments. Timing diagram 600 includes an IR pulse waveform 610 and a phototransistor output waveform 620. IR pulse waveform 610 can be a square wave or other suitable waveform configured to drive a light emitting element (e.g., IR LED 520) where low values (e.g., at or near the bottom of the square wave) correspond to periods where the IR LED is biased off and does not produce any light, and high values (e.g., at or near the top of the square wave) correspond to periods where the IR LED is biased on and produces a light output (e.g., IR, visible spectrum, etc.).

The phototransistor output waveform 620 shows a collector output of the phototransistor (530), which is photo-sensitive and can be biased based on a light from the light emitting element, which can generate a voltage on the base of the phototransistor and forward bias the base-emitter junction, causing the phototransistor to turn on (conduct current). Conversely, the absence of light on the base reverse biases the base-emitter junction causing the phototransistor to turn off, as would be appreciated by one of ordinary skill in the art with the benefit of this disclosure.

The IR pulse waveform 610 pulses high at a first frequency (e.g., 1 KHz or 1000 pulses per second) for a pulse duration of 25 µs. As noted above, the pulse duration is typically set to a conservative value to account for the variation in fall times for all of the optical switches on the input device, as well as for other potential deleterious contributors to delay (e.g., dust, manufacturing tolerances, etc.).

When a user presses a key (680), the switch blocker (510) obstructs the light from the IR LED from reaching the phototransistor 530, which keeps the base-emitter reverse biased and the phototransistor 530 in an "off" state. As such, the collector output (phototransistor output waveform 620 hereinafter referred to as "output waveform 620") remains high (at or above a threshold high value) at the end of the pulse duration (25 µs), and the system reads a key press event. In some embodiments, the threshold high value can be set to 0.7 VCC, however other values are possible (e.g., 0.6 V-0.8 V). In some cases, there can be a small leakage current associated with the phototransistor output, which manifests in output waveform 620 as a negative linear slope, however the leakage current will typically remain above the threshold high value and not affect the detection of the operational state of the key switch (e.g., pressed or unpressed).

When a user does not press a key (690), the switch blocker (510) does not obstruct the light from the IR LED and the light reaches the phototransistor 530, thereby forward-biasing the base-emitter junction and switching phototransistor 530 to an "on" state. As such, the collector output drops down below the threshold low value (referred to as the fall-time) where it remains until the end of the pulse duration (25 µs) when the system determines that the corresponding key is not pressed. Note that the fall time for the particular optical switch shown in FIG. 6 drops to the threshold low value at approximately 5 µs, however the pulse duration is 25 µs, resulting in 20 µs of wasted power to drive the IR LED after the operational state of the optical switch can be reliably determined (e.g., the collector output is at or beow the threshold low value). A threshold low value can be set such that collector output level is at or below the threshold low value at the end of the pulse duration, and the system registers the corresponding key as in an unpressed state. In some embodiments, the threshold low value can be set to 0.3 VCC, however other values are possible (e.g., 0.2 V-0.4 V), as would be appreciated by one of ordinary skill in the art with the benefit of this disclosure.

As described above, the system checks the operational state of the key at the end of the pulse duration. There can be circumstances that cause the fall time to take longer, such as tolerances, dust, manufacturing alignment, etc. Thus, embodiments that do not employ the novel calibration techniques described herein may have a conservative pulse duration to ensure that all key operational state readings are accurate. For example, some key switches may have a fall time of 15-20 µs, so a pulse duration and following read at 10 µs would incorrectly read a pressed state (e.g., if the collector output is still above the threshold high value) when in fact the key is unpressed.

Figure 7:
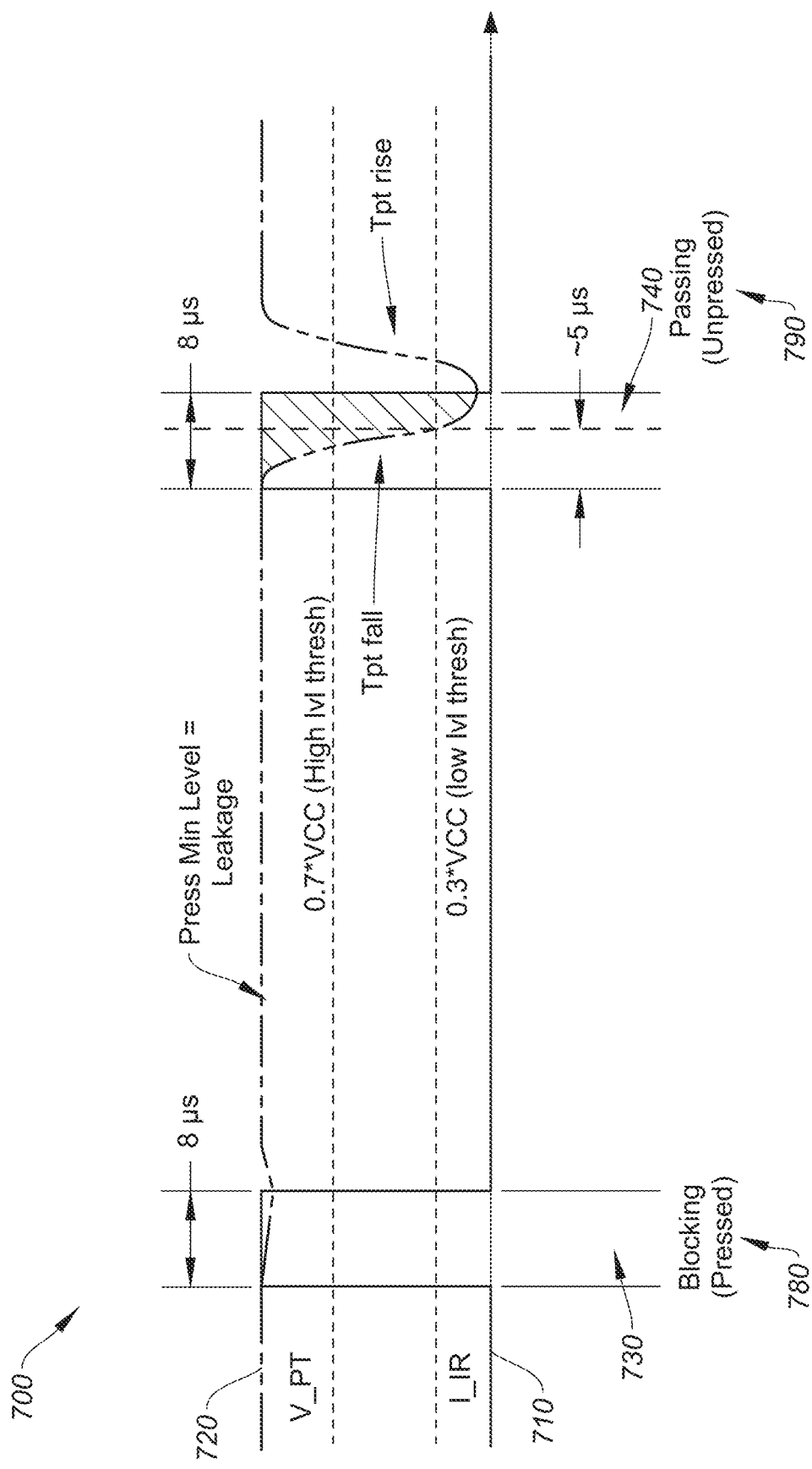
FIG. 7 shows a simplified signal timing diagram for an optical switch sensor using timing calibration, according to certain embodiments.

FIG. 7 shows a simplified signal timing diagram 700 for an optical switch sensor using timing calibration, according to certain embodiments. Timing diagram 700 includes an IR pulse waveform 710 and a phototransistor output waveform 720. Timing diagram 700 shows the outcome of a timing calibration where the pulse durations are adjusted from first pulse durations at 25 µs down to second pulse durations at 8 µs.

Referring back to FIG. 6, the first pulse duration for the light emitting element is set to 25 µs to accommodate a wide variation in fall-times and other unknows that may deleteriously affect phototransistor performance. Assuming that the worst case fall-time (e.g. the time for the phototransistor collector output at a high value above 0.7 VCC to drop to 0.3 VCC) across all key switches in an input device reads 5 µs, the system can reduce (calibrate) the pulse duration to better match the fall-time performance of the device and still maintain a reliable reading, while significantly reducing power consumption for driving the IR LED by 50% or more. Referring to FIG. 7, the new (second) pulse duration is equal to the worst case fall-time (5 µs) plus a buffer value (~3 µs) to ensure that the system reads an accurate operational state of the key (e.g., the phototransistor drops below the threshold low value by the end of the pulse duration). In some aspects, some or all of the key switches can be calibrated in this manner. Different buffer values can be used (e.g., 2 µs, 3 µs, 5 µs, etc.), as would be appreciated by one of ordinary skill in the art with the benefit of this disclosure.

In some embodiments, the calibration methods described herein can operate on firmware in the input device (typical embodiments), or may be facilitated via software running on a host computing device, or a combination thereof.

Figure 8:
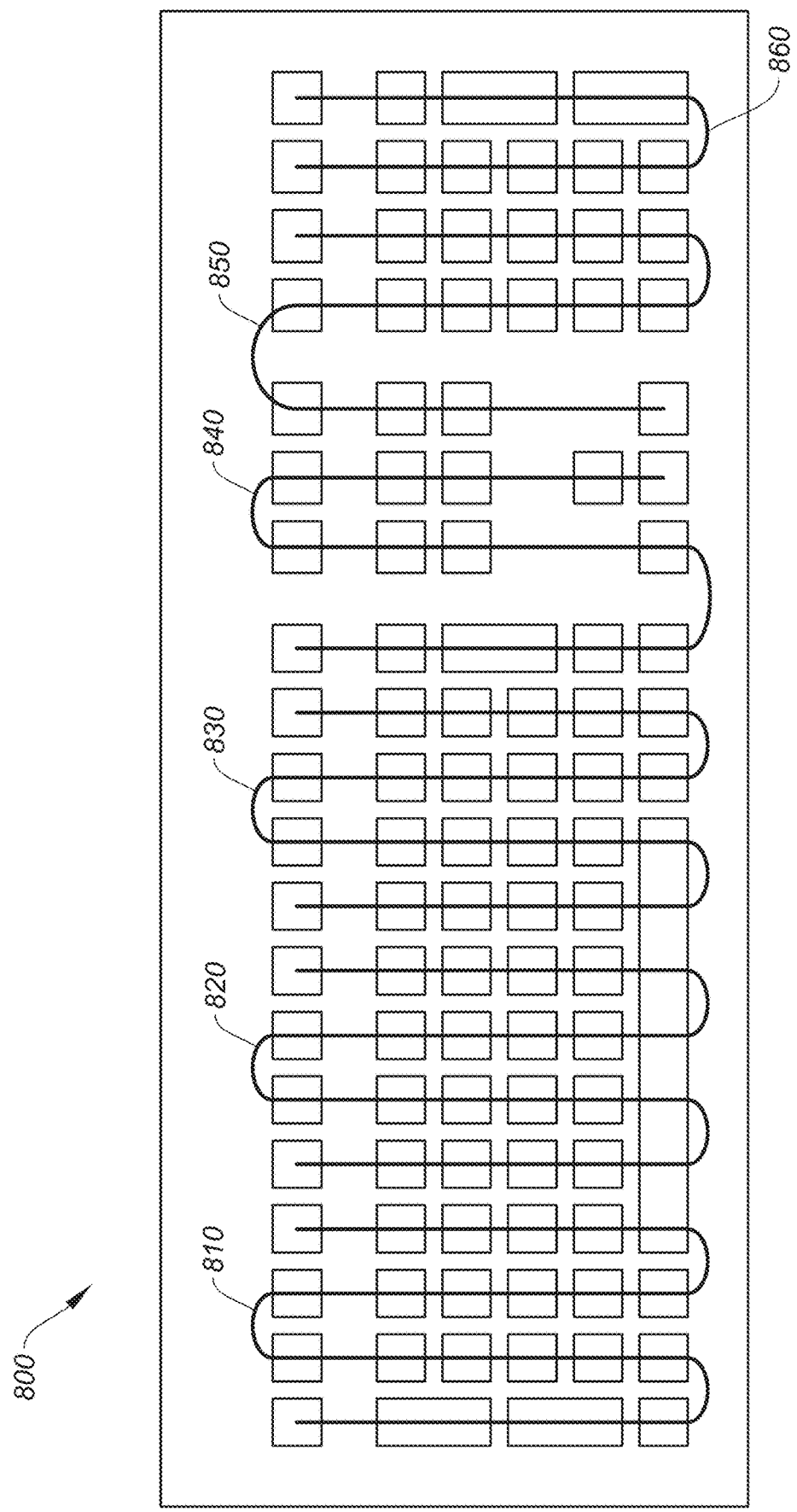
FIG. 8 shows aspects of a key switch drive/read strategy for a keyboard, according to certain embodiments.

FIG. 8 shows aspects of a key switch drive/read strategy for a keyboard 800, according to certain embodiments. Keyboard 800 includes 104 key structures with corresponding key switches (e.g., optical switches, hybrid switches, etc.). In some embodiments, keys can be scanned in groups. That is, multiple light emitting elements can be driven for a pulse duration and the corresponding phototransistor outputs can be read at the end of the pulse duration to determine an operational state for each key in the group, which can allow faster drive/read times. Referring to FIG. 8, keyboard 800 may be serially scanned across six groups 810-860. Any number of keys may be included in a group and any number of groups can be used, as would be appreciated by one of ordinary skill in the art with the benefit of this disclosure. Alternatively, each key can be individually scanned and read, but would require significantly more hardwired read/send lines to each key and would likely take significantly more time to complete a full keyboard read as compared to group-scan embodiments.

As noted above, there are significant benefits of calibrating the pulse duration for the light emitting elements in a keyboard system, including (1) improved power consumption due to the reduced power draw of the shorter pulse duration; and (2) an opportunity to increase the overall scan rate of the keyboard system, because reducing the pulse duration reduces the overall scan time, thus allowing an increased overall scan rate.

By way of example, consider keyboard 800 with 104 keys and six groups 810-860 that each get simultaneously scanned. Assuming a 2.1 V bias voltage ($V_{bias}$) on the IR LED (e.g. to forward bias the diode), a 4.3 mA IR diode current ($I_{LED}$), and a scan rate of 1000 µs (1 ms scan rate) over both pulse durations ($I_{Dur}$) of FIGS. 6-7:

$$\text{PWr}_{LED} = 2.1 \text{ V}[V_{bias}]*4.3 \text{ mA}[I_{LED}]*(25 \text{ µs}[I_{Dur}]/ 1000 \text{ µs}[\text{scan}] = 226 \text{ µW avg/key} \qquad (1)$$

$$\text{Pwr}_{LED} = 2.1 \text{ V}*4.3 \text{ mA}*(5 \text{ µs}+3 \text{ µs(buffer)}/ 1000 \text{ µs} = 72 \text{ µW avg/key} \qquad (2)$$

In equation (1), which corresponds to FIG. 6, a pulse duration of 25 µs yields approximately 226 µW on average per key. Note that fall-time measurements are typically averages and can vary by 1-2 µs, hence the inclusion of a buffer value to account for variation. In equation (2), which corresponds to FIG. 7, a pulse duration of 8 µs (5 µs fall time plus a 3 µs buffer) yields approximately 72 µW on average per key, or a −68% reduction in power consumption. Extrapolated over 104 keys, the 25 µs pulse duration yields approximately 23.5 mA, while the 8 µs yields approximately 7.5 mA, which is substantial, particularly in battery operated input devices where power efficiency is a material factor.

In some aspects, since the IR pulse durations are reduced, the scanning of the switches are performed faster. As such, higher overall scan rates are possible (e.g., 8 kHz) because it takes less time to scan through all of the columns, as would be appreciated by one of ordinary skill in the art with the benefit of this disclosure. In some cases, different drive times can be associated with different columns. One of ordinary skill in the art with the benefit of this disclosure would appreciate the many modifications, variations, and alternative embodiments thereof.

Figure 9:
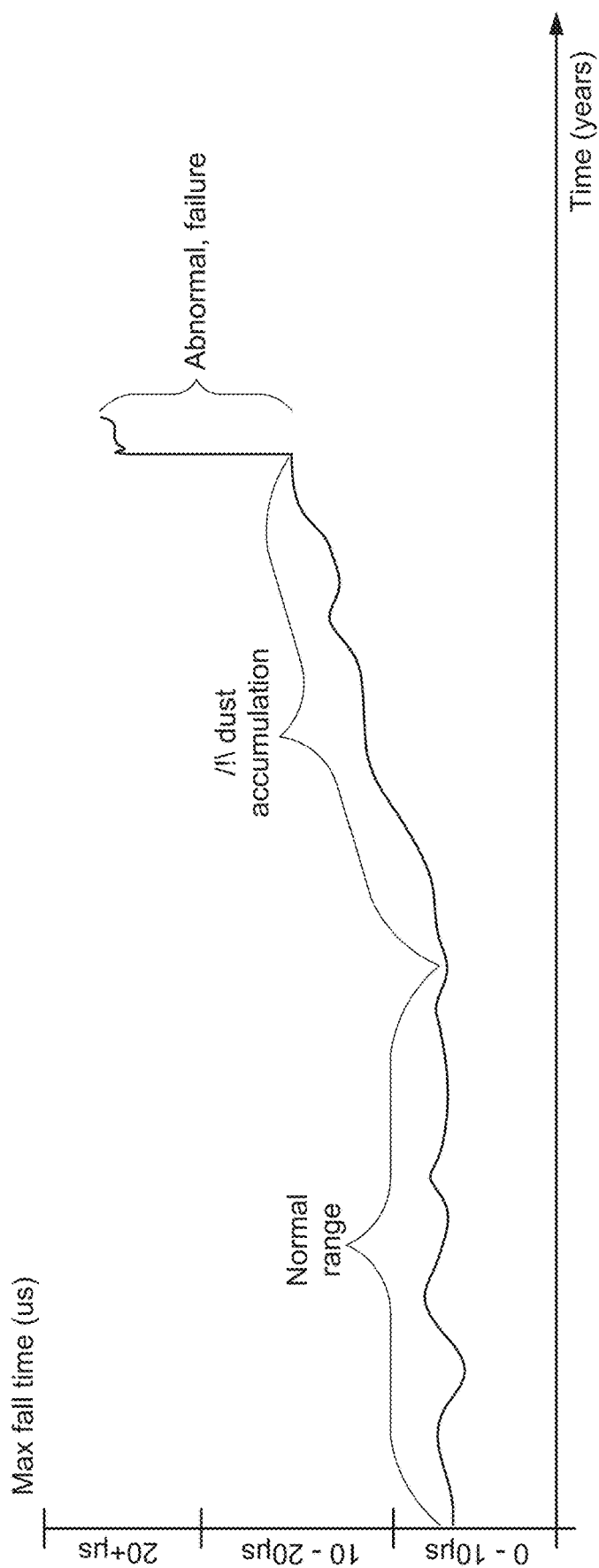
FIG. 9 shows aspects of key switch performance degradation over long term use.

FIG. 9 shows aspects of key switch performance degradation over long term use. More specifically, FIG. 9 shows how a key switch fall time can increase over long term use. By way of example, a key switch may initially operate with a fall time of approximately 8 µs for a number of years of operation. The fall time may increase (e.g., 15 µs) due to dust accumulation until eventually the key switch fails.

The calibration techniques described herein can also be used for failure detection and prevention, according to certain embodiments. Each time the calibration routine is triggered (e.g., during start up, sleep mode, period of inactivity, etc.), there is new fall time measurement data, which can be tracked over time and the system can track trends or detect anomalies. In some cases, a user may remove dust accumulation (e.g., via compressed air) and return the key switch(es) to a normal range of operation. In some cases, the system may detect an increase in fall-time and calibrate the system to increase the pulse duration to ensure that the fall time is not cut short by a pulse duration that may have been shorted for improved power consumption, but now needs to be increased to accommodate a newer, longer fall-time, and can further inform the user of the decrease in power consumption performance, which can be improved once the key switch(es) are either repaired or replaced.

Figure 10:
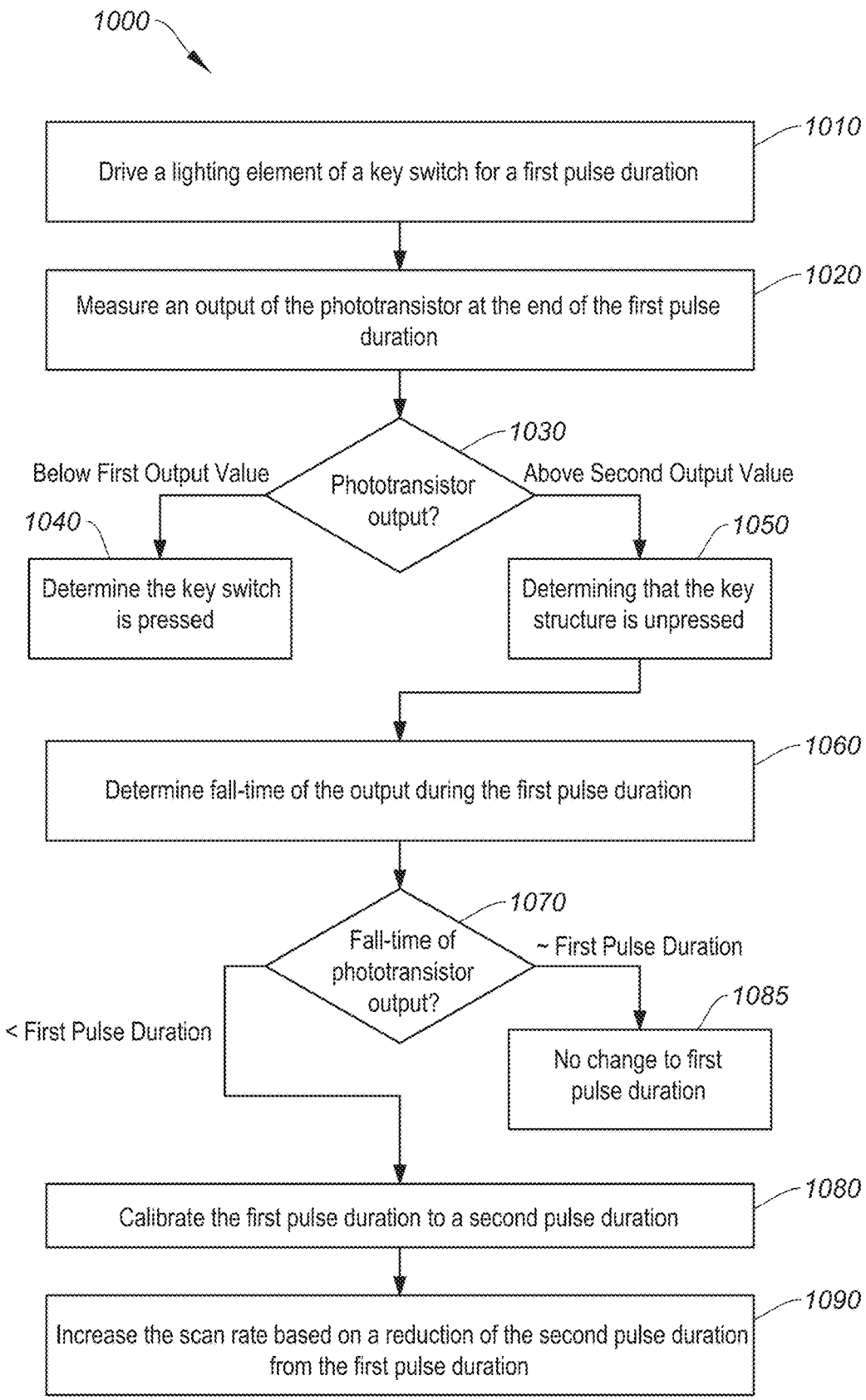
FIG. 10 is a simplified flow chart of a method of calibrating an optical drive for improved performance, according to certain embodiments.

FIG. 10 is a simplified flow chart showing aspects of a method 1000 of calibrating an optical drive time for an optical switch, according to certain embodiments. Method 1000 can be performed by processing logic that may comprise firmware (embedded software), hardware (circuitry, dedicated logic, etc.), software operating on appropriate hardware (such as a general purpose computing system or a dedicated machine), or any combination thereof. In certain embodiments, method 1000 can be performed by aspects of system 200 (e.g., processors 210 and memory 220), system 300, or a combination thereof, and the optical switch may be part of a key structure housed by an input device (e.g., keyboard 140, 800).

At operation 1010, method 1000 can include driving, by one or more processors of the keyboard, a lighting element (520) of a key switch for a first pulse duration, according to certain embodiments. Typically, the key switch is housed by a key structure and further includes a switch blocker (510) configured to obstruct a line-of-sight between the lighting element and the phototransistor (530) when the key structure is pressed and clear the line-of-sight when the key structure is unpressed, as shown in FIGS. 5A and 5B. Exemplary embodiments typically use a default open key switch such that the phototransistor is biased on when the key is unpressed. In some aspects, the lighting element is an infrared (IR) diode and the phototransistor is an npn-type transistor. In some embodiments, the phototransistor includes a base-emitter junction that is forward biased when light from the lighting element illuminates a base of the phototransistor, thereby turning the phototransistor on such that the output falls below the first output value (e.g., a threshold value), and the base-emitter junction is reverse biased when the light from the lighting element does not illuminate the base of the phototransistor, thereby turning the phototransistor off such that the output remains above the second output value (e.g., a threshold value). In some implementations, the first output value is between 0.2 and 0.4 of VCC, and the second output value is between 0.6 and 0.8 of VCC.

At operation 1020, method 1000 can include measuring an output of a phototransistor at an end of the first pulse duration, according to certain embodiments.

At operation 1040, method 1000 can include determining that the key switch is pressed when the output of the phototransistor is below a first output value (determined at operation 1030) at an end of the first pulse duration, according to certain embodiments.

At operation 1050, method 1000 can include determining that the key switch is unpressed when the output of the phototransistor is above a second output value (determined at operation 1030) at the end of the first pulse duration, according to certain embodiments.

At operation 1060, method 1000 can include determining a fall-time of the output of the phototransistor during the first pulse duration, according to certain embodiments.

At operation 1080, method 1000 can include calibrating the first pulse duration to a second pulse duration when the fall time of the output of the phototransistor is less than the first pulse duration (determined at operation 1070), according to certain embodiments. Typically, the second pulse duration is set to be greater than the fall time and less than the first pulse duration. In some cases, the second pulse duration can be approximately equal to the maximum fall time across all of the keys (or subset thereof) of the keyboard, plus a buffer (e.g., 3-5 µs, or the like), as would be appreciated by one of ordinary skill in the art with the benefit of this disclosure.

At operation 1085, method 1000 can include making no changes to the first pulse duration when the fall time of the phototransistor output is within a tolerance value of the first pulse duration (e.g., within 5 µs), according to certain embodiments.

At operation 1090, method 1000 can include driving the lighting element at a periodic scan rate (this is typically already done during normal operation) and increasing the scan rate based on a reduction of the second pulse duration from the first pulse duration, according to certain embodiments.

As noted above, the second pulse duration is typically equal to the fall time plus a buffer time between 2 µs and 10 µs. In some cases, the phototransistor is powered by a power supply voltage (VCC), wherein the first output value is between 0.2 and 0.4 of VCC, and wherein the second output value is between 0.6 and 0.8 of VCC. The IR diode may also be powered by VCC, as well as other components of the input device.

It should be appreciated that the specific steps illustrated in FIG. 10 provide a particular method 1000 for calibrating an optical drive time for an optical switch, according to certain embodiments. Other sequences of steps may also be performed according to alternative embodiments. Furthermore, additional steps may be added or removed depending on the particular application. Any combination of changes can be used and one of ordinary skill in the art with the benefit of this disclosure would understand the many variations, modifications, and alternative embodiments thereof.

As such, the calibration process, the fall-time measurement process is simple from the ESW/processor perspective and can be performed very quickly (e.g., <200 µs). A high-level, simplified explanation of the calibration process, as described in more detail above, can be summarized, at least in part, as follows: (1) normal key processing can be momentarily disabled; (2) start (hardware) timer and IR pulse; (3) when the signal (PT) falls to the threshold low value, the timer and IR pulse is stopped and the actual time elapsed (e.g., the fall time) is recorded; (4) perform for all keys (or subset such as columns); (5) apply new settings (e.g., new optimized IR pulse duration); and (6) resume normal key processing. In some practical applications, the user should not be depressing the keys during the calibration process to avoid deleteriously impacting the measurements. Some examples of good calibration periods include before the input device enters a deep sleep mode (e.g., when the user has not pressed a key in a long period of time (e.g., >10 minutes)), during system start-up, or the like. One reason why normally open switches may be beneficial is that otherwise the calibration process would require all keys to-be-calibrated would need to be pressed during the measurement time, which is impracticable. One of ordinary skill in the art with the benefit of this disclosure would appreciate the many modifications, variations, and alternative embodiments thereof.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter. The various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The system or systems discussed herein are not limited to any particular hardware architecture or configuration. A computing device can include any suitable arrangement of components that provide a result conditioned on one or more inputs. Suitable computing devices include multi-purpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another or may be combined in various ways. All possible combinations and sub-combinations are intended to fall within the scope of the present disclosure. In addition, certain method or process blocks may be omitted in some embodiments. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

What is claimed is:

1. A keyboard system comprising:
a key structure including a key switch comprised of:
a lighting element; and
a phototransistor;
one or more processors communicatively coupled to the key switch, the one or more processors configured to:
drive the lighting element for a first pulse duration;
determine an output of the phototransistor at an end of the first pulse duration;
determine that the key structure is pressed when the output of the phototransistor is below a first output value at the end of the first pulse duration;
determine that the key structure is unpressed when the output of the phototransistor is above a second output value at the end of the first pulse duration;
determine a fall-time of the output of the phototransistor during the first pulse duration; and
calibrate the first pulse duration to a second pulse duration when the fall time of the output of the phototransistor is less than the first pulse duration,
wherein the second pulse duration is greater than the fall time and less than the first pulse duration.

2. The keyboard system of claim 1 wherein the key structure further comprises:
a switch blocker configured to:
obstruct a line-of-sight between the lighting element and the phototransistor when the key structure is pressed; and
clear the line-of-sight when the key structure is unpressed.

3. The keyboard system of claim 2 wherein the key switch is a hybrid key switch including:
a contactless key switch comprising the lighting element, the phototransistor, and the switch blocker; and
a contact-based key switch.

4. The keyboard system of claim 3 wherein the contactless key switch is an optical key switch and the contact-based key switch is a galvanic key switch.

5. The keyboard system of claim 2 wherein the key switch is a normally open switch.

6. The keyboard system of claim 1 wherein the lighting element is an infrared (IR) diode and the phototransistor is an npn-type transistor.

7. The keyboard system of claim 1 wherein a base-emitter junction of the phototransistor is forward biased when a light from the lighting element illuminates a base of the phototransistor, thereby turning the phototransistor on such that the output falls below the first output value, and
wherein the base-emitter junction is reverse biased when the light from the lighting element does not illuminate the base of the phototransistor, thereby turning the phototransistor off such that the output remains above the second output value.

8. The keyboard system of claim 1 wherein the second pulse duration is equal to the fall time plus a buffer time between 2 µs and 10 µs.

9. The keyboard system of claim 1 wherein the phototransistor is powered by a power supply voltage (VCC), wherein the first output value is between 0.2 and 0.4 of VCC, and wherein the second output value is between 0.6 and 0.8 of VCC.

10. The keyboard system of claim 1 wherein calibrating the first pulse duration to the second pulse duration occurs during a sleep mode of operation.

11. The keyboard system of claim 1 further comprising a plurality of key structures, each key structure of the plurality of key structures having a corresponding lighting element and corresponding phototransistor,
wherein determining the fall time of the output includes determining a maximum of the fall time over the plurality of key structures, and
wherein the second pulse duration is greater than the maximum of the fall time and less than the first pulse duration.

12. The keyboard system of claim 1 wherein the one or more processors are operable to:
track changes in the fall-time of the output over a period of use; and
generate an alert when the fall-time exceeds a threshold change in fall-time over the period of use.

13. The keyboard system of claim 1 wherein the one or more processors drive the lighting element at a periodic scan rate, wherein the scan rate is increased based on a reduction of the second pulse duration from the first pulse duration.

14. A method of operating a keyboard, the method comprising:
driving, by one or more processors of the keyboard, a lighting element of a key switch for a first pulse duration;
measuring an output of a phototransistor at an end of the first pulse duration;
determining that the key switch is pressed when the output of the phototransistor is below a first output value at the end of the first pulse duration;
determining that the key switch is unpressed when the output of the phototransistor is above a second output value at the end of the first pulse duration;
determining a fall-time of the output of the phototransistor during the first pulse duration; and
calibrating the first pulse duration to a second pulse duration when the fall time of the output of the phototransistor is less than the first pulse duration,
wherein the second pulse duration is greater than the fall time and less than the first pulse duration.

15. The method of claim 14 wherein the key switch is housed by a key structure, wherein the key structure further comprises:
a switch blocker configured to:
obstruct a line-of-sight between the lighting element and the phototransistor when the key structure is pressed; and
clear the line-of-sight when the key structure is unpressed.

16. The method of claim 14 wherein the lighting element is an infrared (IR) diode and the phototransistor is an npn-type transistor.

17. The method of claim 14 wherein a base-emitter junction of the phototransistor is forward biased when light from the lighting element illuminates a base of the phototransistor, thereby turning the phototransistor on such that the output falls below the first output value, and
wherein the base-emitter junction is reverse biased when the light from the lighting element does not illuminate the base of the phototransistor, thereby turning the phototransistor off such that the output remains above the second output value.

18. The method of claim 14 wherein the second pulse duration is equal to the fall time plus a buffer time between 2 µs and 10 µs.

19. The method of claim 14 wherein the phototransistor is powered by a power supply voltage (VCC), wherein the first output value is between 0.2 and 0.4 of VCC, and wherein the second output value is between 0.6 and 0.8 of VCC.

20. The method of claim 14 further comprising:
driving the lighting element at a periodic scan rate; and
increasing the scan rate based on a reduction of the second pulse duration from the first pulse duration.

* * * * *